(12) United States Patent
Yang et al.

(10) Patent No.: US 11,079,172 B2
(45) Date of Patent: Aug. 3, 2021

(54) APPLIANCE HAVING TOUCH SENSOR ASSEMBLY

(71) Applicant: LG Electronics Inc., Seoul (KR)

(72) Inventors: Jaesung Yang, Seoul (KR); Hyunki Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 13 days.

(21) Appl. No.: 16/585,915

(22) Filed: Sep. 27, 2019

(65) Prior Publication Data

US 2020/0025439 A1 Jan. 23, 2020

Related U.S. Application Data

(63) Continuation of application No. 15/675,914, filed on Aug. 14, 2017, now Pat. No. 10,495,371.

(30) Foreign Application Priority Data

Aug. 25, 2016 (KR) .................. 10-2016-0108239

(51) Int. Cl.
| | |
|---|---|
| *G06F 3/041* | (2006.01) |
| *F25D 29/00* | (2006.01) |
| *H03K 17/96* | (2006.01) |
| *F25D 23/02* | (2006.01) |

(52) U.S. Cl.
CPC ........... *F25D 29/00* (2013.01); *F25D 23/028* (2013.01); *F25D 29/005* (2013.01); *G06F 3/0412* (2013.01); *H03K 17/964* (2013.01); *H03K 17/9643* (2013.01); *H03K 2217/96023* (2013.01)

(58) Field of Classification Search
CPC .... G06F 3/0412; G06F 3/0414; F25D 23/028; F25D 29/00; F25D 29/005; H03K 17/964; H03K 17/9643; H03K 2217/96023
See application file for complete search history.

(56) References Cited

U.S. PATENT DOCUMENTS

| | | | | |
|---|---|---|---|---|
| 2010/0149000 | A1* | 6/2010 | Heimann | H03K 17/964 341/34 |
| 2011/0080347 | A1* | 4/2011 | Steeves | G06F 3/016 345/173 |

FOREIGN PATENT DOCUMENTS

CN 105577156 5/2016

* cited by examiner

*Primary Examiner* — Lisa S Landis
(74) *Attorney, Agent, or Firm* — Fish & Richardson P.C.

(57) ABSTRACT

An appliance that includes: a front panel having a touch point; a touch board including: a first side attached to a location on a rear surface of the front panel, the location corresponding to the touch point; a second side opposite to the first side; a pressing portion; and one or more holes defined around the pressing portion and configured to enable an elastic movement of the pressing portion; a holder that is attached to the second side of the touch board, the holder having a receiving portion; a piezo disc configured to be inserted in the receiving portion of the holder and contact the pressing portion; a guide board having a seating hole configured to receive the holder and the piezo disc; and a first adhesive member attached to the first side of the touch board and configured to attach to the rear surface of the front panel.

24 Claims, 21 Drawing Sheets

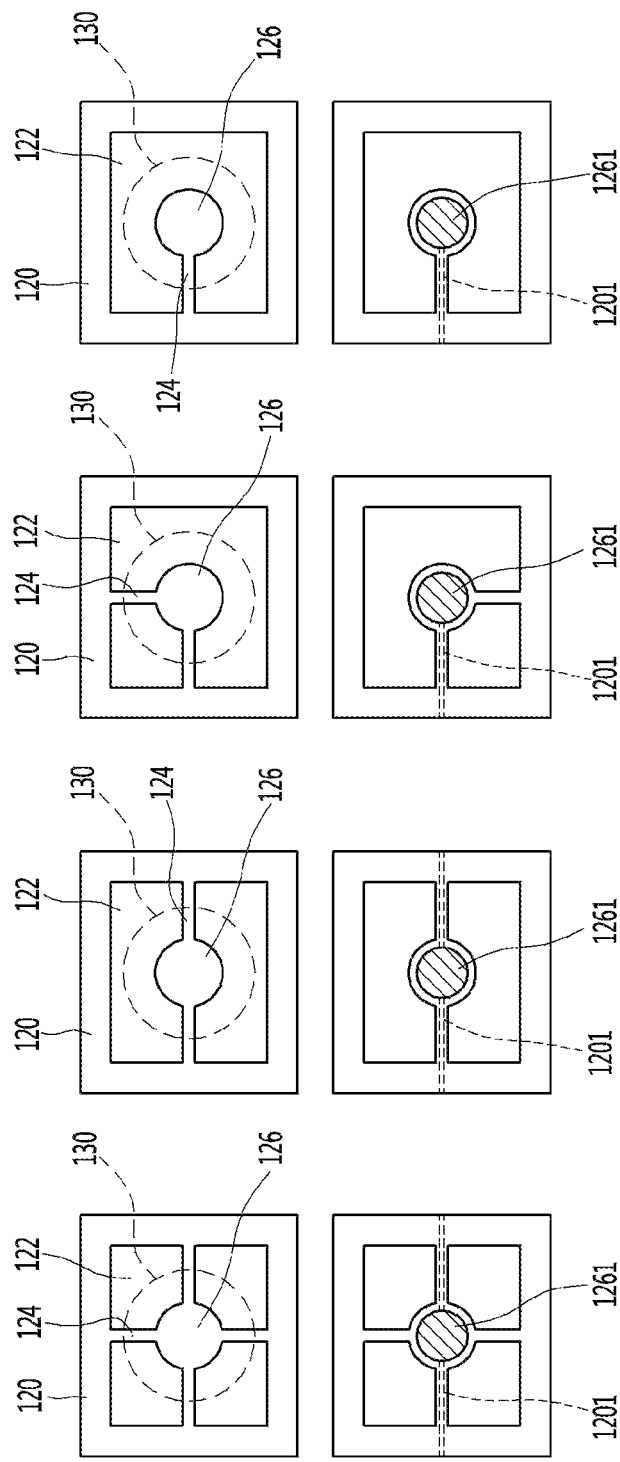

FIG. 11
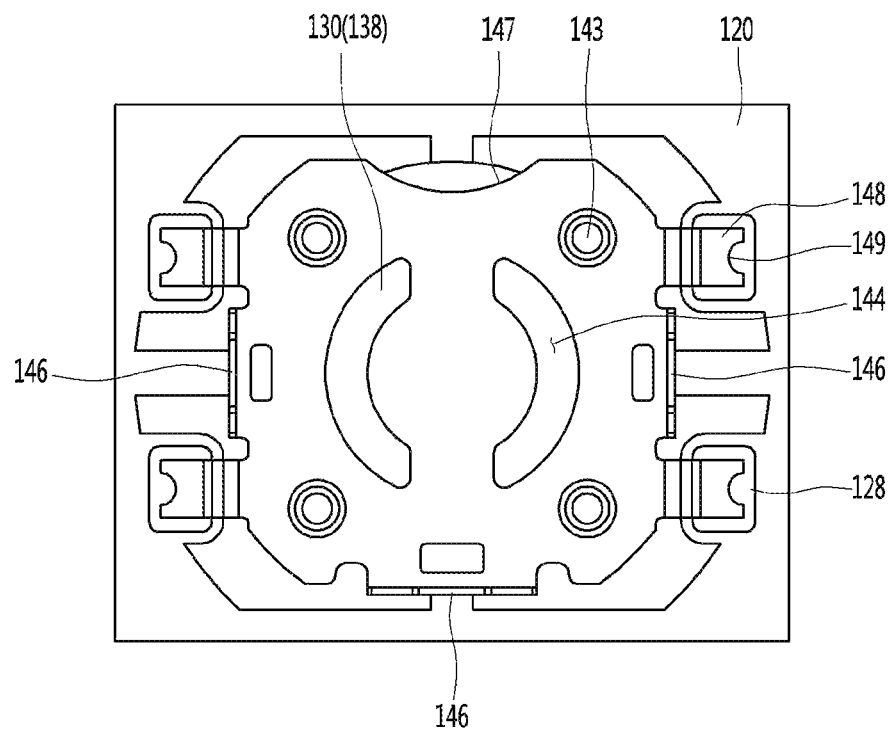
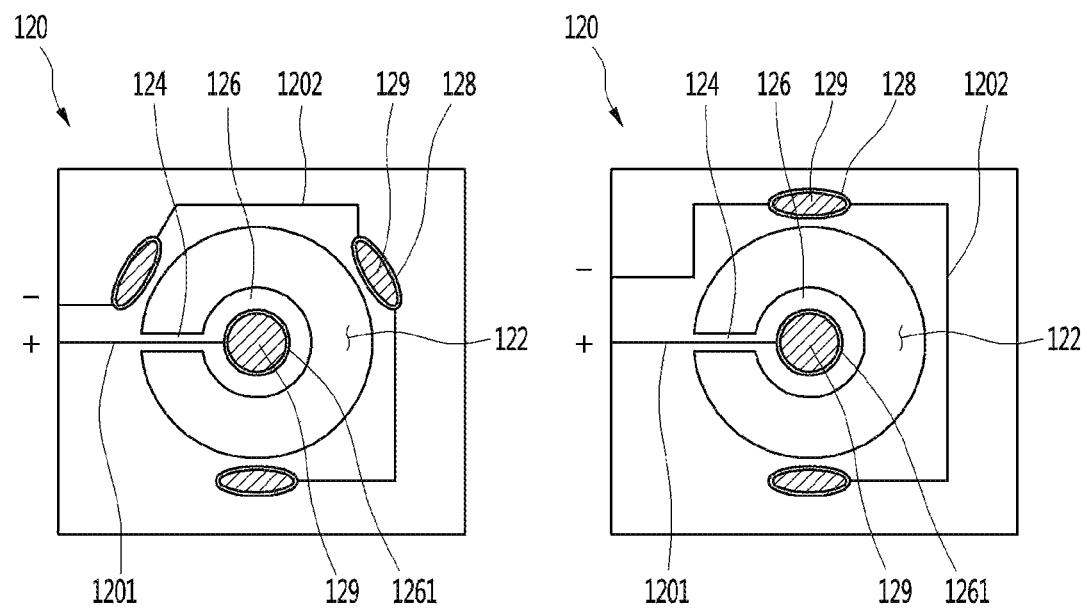
FIG. 12A  FIG. 12B

APPLIANCE HAVING TOUCH SENSOR ASSEMBLY

CROSS-REFERENCE TO RELATED APPLICATIONS

The present application is a continuation of U.S. application Ser. No. 15/675,914, filed on Aug. 14, 2017, which claims priority under 35 U.S.C. § 119 to Korean Patent Application No. 10-2016-0108239 filed on Aug. 25, 2016, the contents of which are incorporated herein by reference in their entirety.

TECHNICAL FIELD

The present disclosure relates to an appliance having a touch sensor assembly.

BACKGROUND

Refrigerators, depending on the positions of a refrigerator compartment and a freezer compartment, can be classified into a top mount refrigerator having a freezer compartment on the top and a refrigerator compartment on the bottom, a bottom freezer refrigerator having a refrigerator compartment on the top and a freezer compartment on the bottom, and a side-by-side refrigerator having a freezer compartment and a refrigerator compartment left and right.

In a side-by-side refrigerator, an evaporator is disposed in the rear portion of the freezer compartment and the air in the freezer compartment and the refrigerator compartment is sucked and sent to the evaporator from the bottoms of the compartments. Cold air produced through the evaporator is supplied into the refrigerator compartment and the freezer compartment through the top of the compartments.

The doors of refrigerators are generally rotatably coupled to the front of the refrigerators and when they are closed, their front exterior surfaces are exposed to their users. As refrigerator doors typically remain closed, highly aesthetic materials, including panels having various patterns, may be attached to the front sides of the refrigerator doors to enhance their aesthetic values.

Recently, users increasingly prefer to appliances having metallic simple external appearances. However, refrigerators have not only a display for users to be able to check the operating statuses, but a button unit for inputting operating conditions on the front sides of the doors, so it is not aesthetically preferable.

In consideration of this problem, recently, refrigerator doors having a structure that hides a display and operation button unit at normal times, but shows them only when a user wants to use them are being increasingly studied. This function is defined as so-called a hidden display or a hidden button in some cases.

It is typically difficult to apply a button of electrostatic touch type to refrigerator doors having metallic front panels due to leakage of static electricity. In addition, as metal is typically resistant to flexure, it may be difficult to apply a button of constant pressure type. Further, it may be difficult to achieve a metallic panel having hidden buttons particularly in the touch sensing type.

Accordingly, a sensor that can reliably sense a touch input even on a metallic panel is desired. Such a sensor can be used in various applications, including on the front panels for refrigerator doors and in other appliances having metallic outer structures to which hidden button of touch type can be applied.

SUMMARY

This disclosure relates to an appliance having a touch sensor assembly suitable for integration onto a metallic panel.

In one aspect, an appliance can include: a front panel defining an external surface of the appliance and having a touch point; a touch board including: a first side attached to a location on a rear surface of the front panel, the location corresponding to the touch point; a second side opposite to the first side; a pressing portion; and one or more holes defined around the pressing portion and configured to enable an elastic movement of the pressing portion; a holder that is positioned to overlap with the pressing portion and the one or more holes, and that is attached to the second side of the touch board, the holder having a receiving portion; a piezo disc having a first electrode and a second electrode, the piezo disc configured to be inserted in the receiving portion of the holder and contact the pressing portion; a guide board having a seating hole configured to receive the holder and the piezo disc, the guide board positioned on the second side of the touch board; and a first adhesive member attached to the first side of the touch board and configured to attach to the rear surface of the front panel.

Implementations may include one or more of the following features. For example, the holder includes: a rear side support portion configured to support a rear side of the piezo disc; fixing legs extending from edges of the rear side support portion and attached to the second side of the touch board; and support wings located at the edges of the rear side support portion and configured to guide insertion of the piezo disc.

In some implementations, the rear side support portion has a rectangular shape; the fixing legs extend from first and second edges of the rear support side portion, the first and second edges facing each other; and the fixing legs include first through fourth fixing legs defining first and second pairs of fixing legs, the first and second pairs of fixing legs located at the first and second edges, respectively.

In some implementations, the support wings include: first and second support wings located between respective first and second pairs of fixing legs; and a third support wing located at a third edge different from the first and second edges of the rear side support portion.

In some implementations, the rear side support portion includes a guide groove located at a fourth edge of the rear side support portion opposite to the third edge.

In some implementations, a gap between the first support wing and the second support wing corresponds to a diameter of the piezo disc to guide insertion of the piezo disc.

In some implementations, the holder includes one or more pressing projections protruding from the rear side support portion and configured to apply pressure on the rear side of the piezo disc.

In some implementations, the pressing projections are located adjacent to corners of the rear side support portion.

In some implementations, the holder includes slits located at an interior portion of the rear side support portion, and the slits are symmetrical and arranged to face each other.

In some implementations, the slits are positioned interior to a region having corners defined by the pressing projections and symmetrically arranged about a center of the rear side support portion.

In some implementations, the appliance includes: a second adhesive member arranged between the touch board and the guide board; and a third adhesive member positioned on a rear side of the guide board.

In some implementations, the touch board includes one or more bridges defined by one or more holes, the one or more bridges configured to suspend the pressing portion within the touch board.

In some implementations, the one or more bridges include first, second, third, and fourth bridges, and the first through fourth bridges are each arranged at a 90 degree angle relative to adjacent bridges.

In some implementations, the one or more bridges include first and second bridges, and the first and second bridges are each arranged at a 180 degree angle relative to one another.

In some implementations, the one or more bridges include first and second bridges, and the first and second bridges are each arranged at an angle less than or equal to 90 degrees relative to one another.

In some implementations, the one or more bridges include a single bridge.

In some implementations, the touch board includes fixing faces located on the second side of the touch board and configured to attach to the fixing legs.

The details of one or more implementations are set forth in the accompanying drawings and the description below. Other features will be apparent from the description and drawings, and from the claims. The description and specific examples below are given by way of illustration only, and various changes and modifications will be apparent.

BRIEF DESCRIPTION OF THE DRAWINGS

FIGS. 6A to 6D are front and rear views illustrating various implementations of the touch board part A illustrated in FIG. 5;

FIG. 11 is a rear view of FIG. 10;

FIGS. 12A and 12B are views illustrating various implementations of the touch board illustrated in FIG. 5;

DETAILED DESCRIPTION

Various implementations of a touch sensor assembly suitable for integration onto a metallic panel and methods for assembling the touch sensor assembly is described herein.

In some implementations, a touch sensor assembly having a high sensitivity or sensing reliability can be manufactured using a simple process due to the touch sensor assembly having a simple structure and a small number of parts. The touch sensor assembly may be easily manufactured using both manual and automatic manufacturing techniques.

In some implementations, the touch sensor assembly has high strength and durability against repetitive user inputs. The touch sensor assembly can be securely attached to the panel having a touch area to improve sensing reliability.

In some implementations, the touch sensor assembly structure can be more freely designed. For example, various piezo discs can be used to change the structure for fixing the piezo disc, expanding design freedom of the touch sensor assembly. As another example, internal structure of the touch sensor assembly can be modified in various ways to adapt to specific applications and placements of the touch points.

Figure 1:
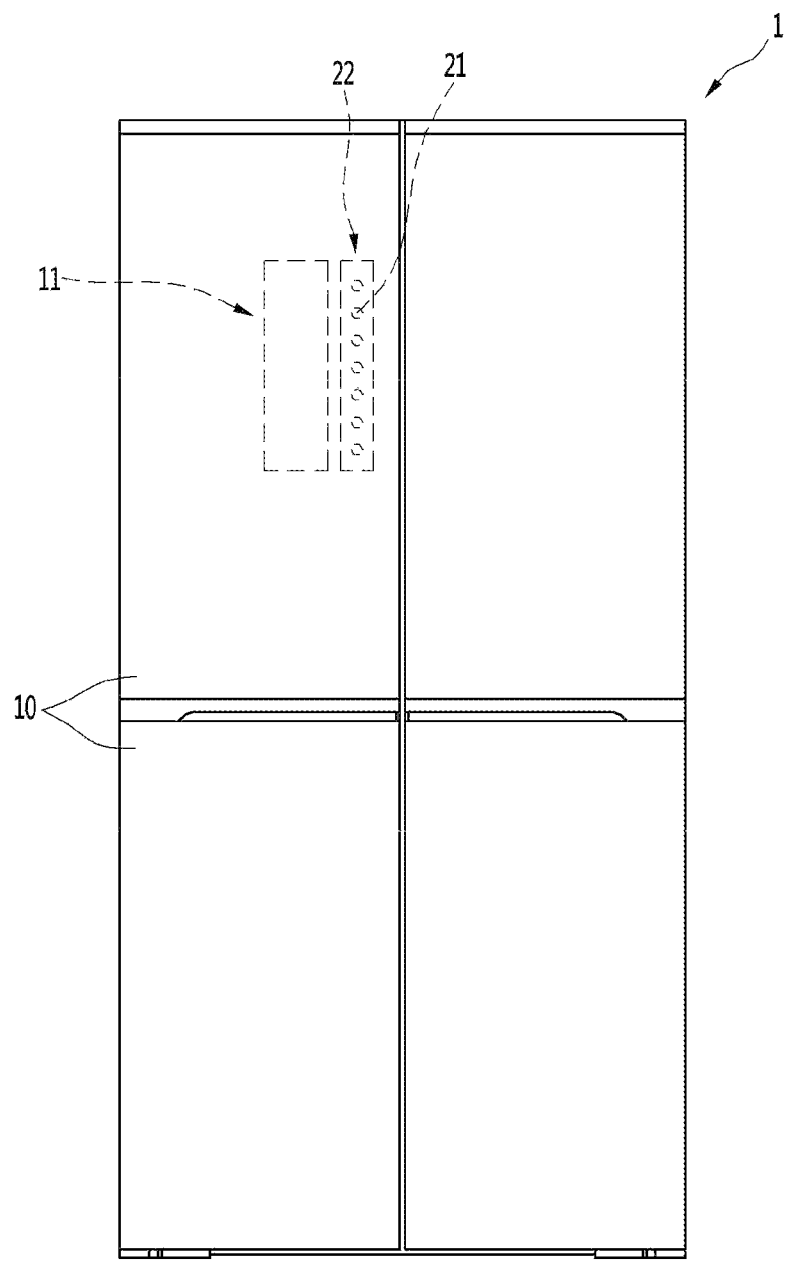
FIG. 1 is a front view illustrating an exterior of an example of a refrigerator including a touch sensor assembly.
Figure 2:
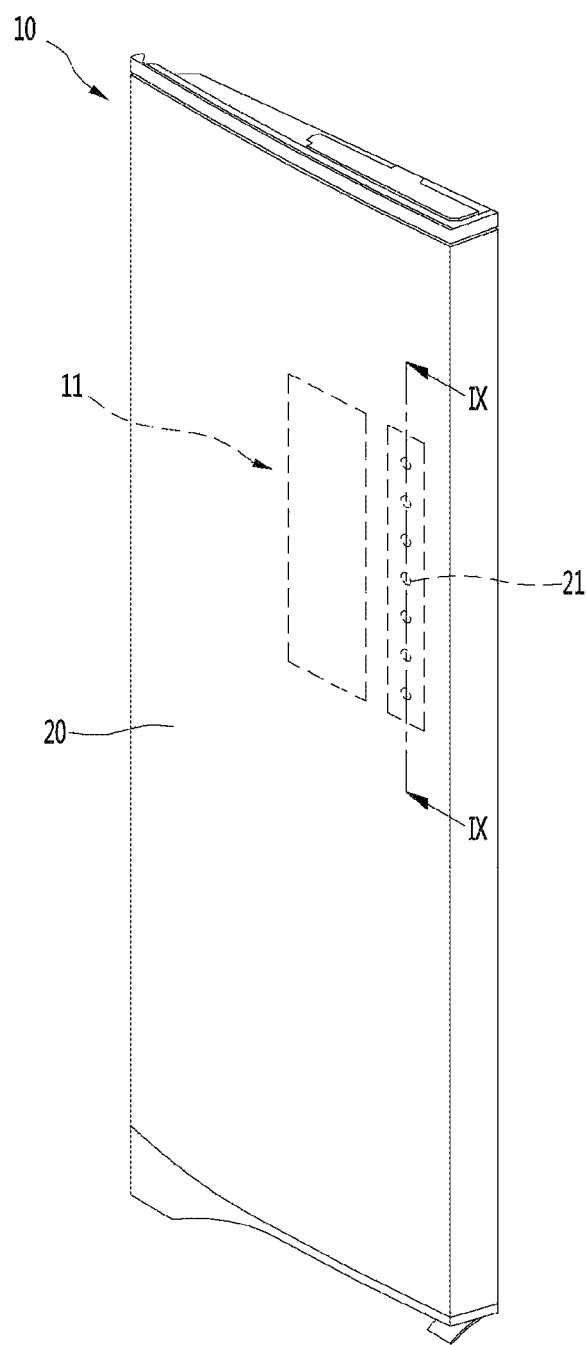
FIG. 2 is a perspective view illustrating a door of the refrigerator including the touch sensor assembly illustrated in FIG. 1.
Figure 3:
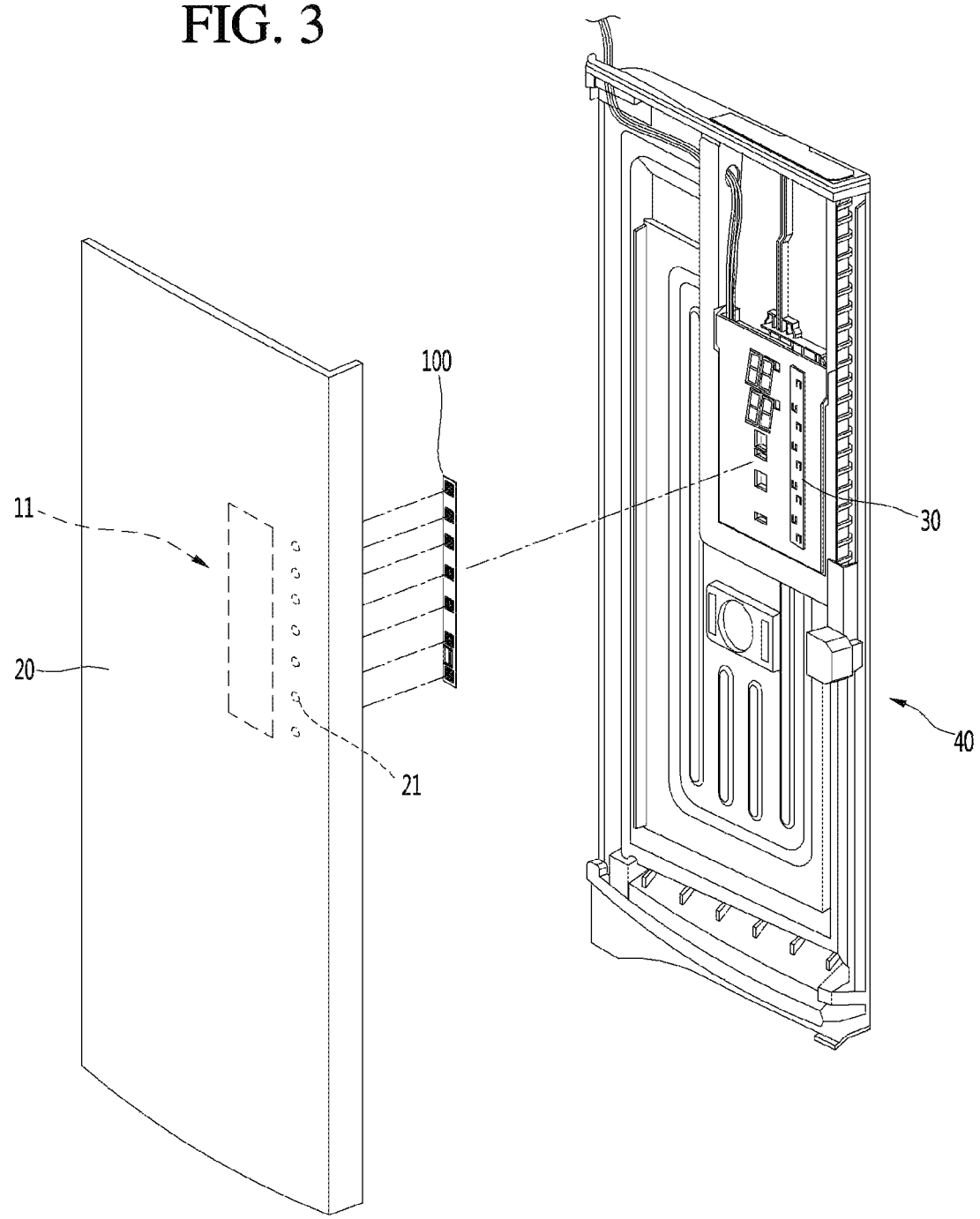
FIG. 3 is a partial exploded perspective view of the door illustrated in FIG. 2.

FIG. 1 illustrates a front exterior view of a refrigerator having a touch sensor; FIG. 2 illustrates a perspective view of a door of the refrigerator including the touch sensor assembly illustrated in FIG. 1; and FIG. 3 is a partial exploded perspective view of the door illustrated in FIG. 2.

As shown in FIG. 1, a refrigerator 1 according to an implementation of the present disclosure has an external shape formed by a cabinet that provides a storage space and refrigerator doors 10 that are coupled to the cabinet to open/close the storage space.

The storage space provided by the cabinet can be divided left and right and/or up and down and the refrigerator doors 10 are positioned on the front faces of the divided sections of the storage space to open/close the sections. The doors 10 open/close the storage space by sliding or rotating and, when the doors are closed, they define a frontal exterior shape of the refrigerator.

A display area 11 and a touch area 22 may be provided on the front side of any one of the refrigerator doors 10. For example, the display area 11 and the touch area 22 may be provided at eye-level of an adult user.

The display area 11, which is provided to show the operating statuses of the refrigerator 11 to the outside, may be configured to show symbols or numbers by transmitting light from the inside the doors 10 (see FIG. 2), so a user can check the operating statuses of the refrigerator in front of the doors 10.

When light is not emitted from the inside the doors, the display area 11 is not visible to the outside (see FIG. 1), giving the front sides of the doors an aesthetically pleasing simple look.

The touch area 22, which a user touches to input operating conditions of the refrigerator 1, is provided close to the display area 11. A plurality of touch points 21 is formed in the touch area 22. When a user presses a desired touch point 21, the refrigerator can be operated in the operating condition set for the pressed touch point 21. The touch points 21 may be marked by surface processing such as printing or etching to facilitate recognition of the touch points by a user.

The touch area 22 does not need to be provided on the same door 10 together with the display area 11. In some implementations, the touch area 22 may be provided on other doors 10. In some implementations, the touch area 22 may be provided on a side of the cabinet.

The touch points 21, similar to the display area 11, may be formed such that they are not always visible, and are made visible to the outside only when light is emitted from inside of the doors 10 so that a user can recognize them.

The front panel 20 having the display area 11 and the touch area 22 forms the frontal exterior shape of the door 10. For example, the front panel 20 may be formed from a metal plate, a steel plate, or stainless steel plate. A touch sensor assembly 100 may be fixed to an area corresponding to the touch area 22 on the rear side of the front panel 20.

A support member 30 may be disposed inside a door liner 40 attached to the rear of the front panel 20 to increase cohesiveness between the touch sensor assembly 100 and the front panel 20. When the front panel 20 with the touch sensor assembly 100 attached to the panel's rear side and the door liner 40 are assembled together, the support member 30 inside the liner 40 presses the rear side of the touch sensor assembly 100. The pressing of the rear side of the touch sensor assembly 100 brings the touch sensor assembly 100 in close contact with the rear side of the front panel 20.

Further, it may be possible to fasten the front panel 20 and the door liner 40 to each other with the touch sensor assembly 100 fixed to the front side of the support member 30 to bring the front side of the touch sensor assembly 100 in close contact with the rear side of the front panel 20. Furthermore, it may also be possible to support the touch sensor assembly 100 against the front panel 20 in various ways when assembling the front panel 20 and the door liner 40.

Figure 4:
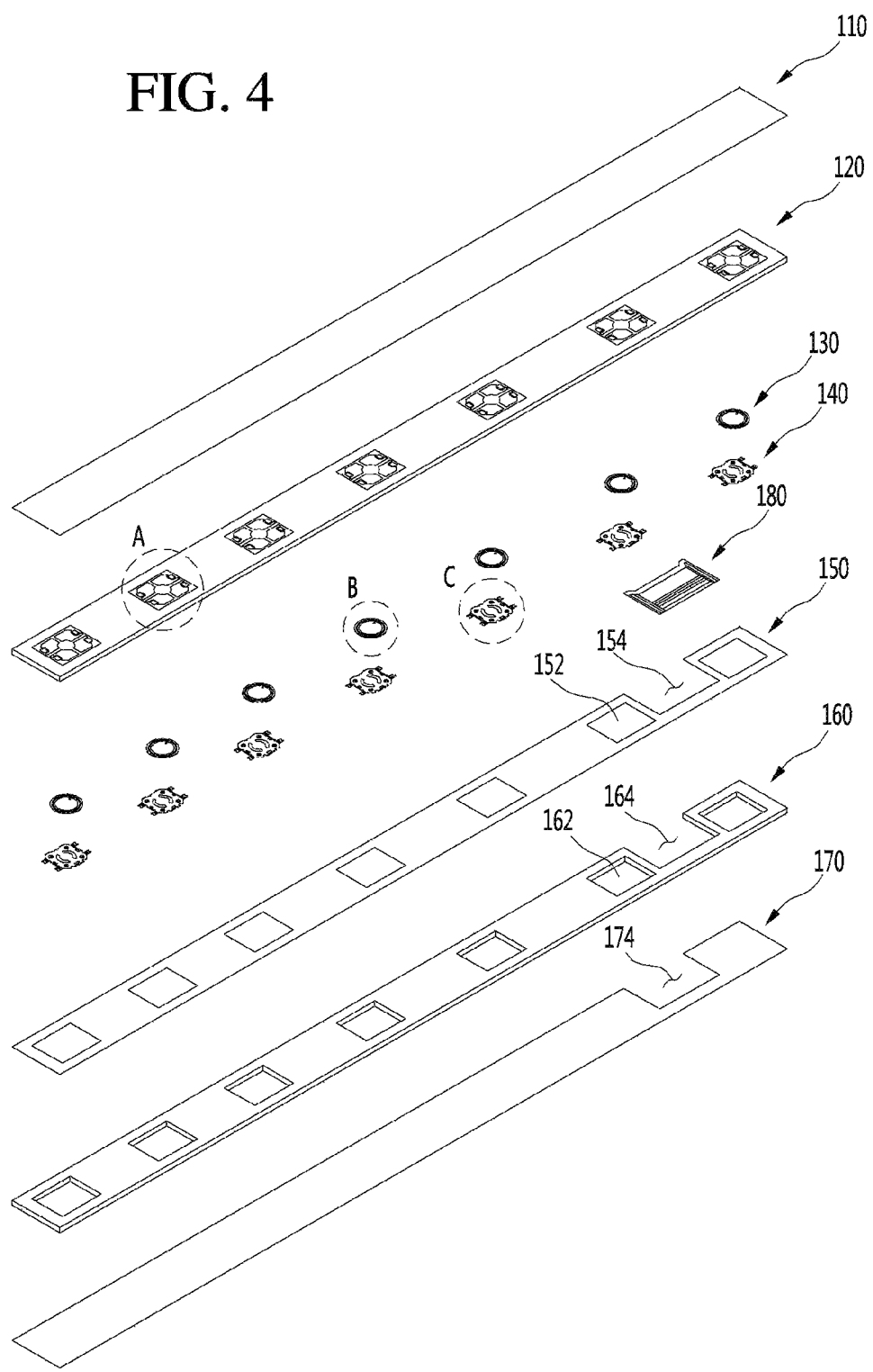
FIG. 4 is an exploded perspective view of the touch sensor assembly illustrated in FIG. 3.
Figure 5:
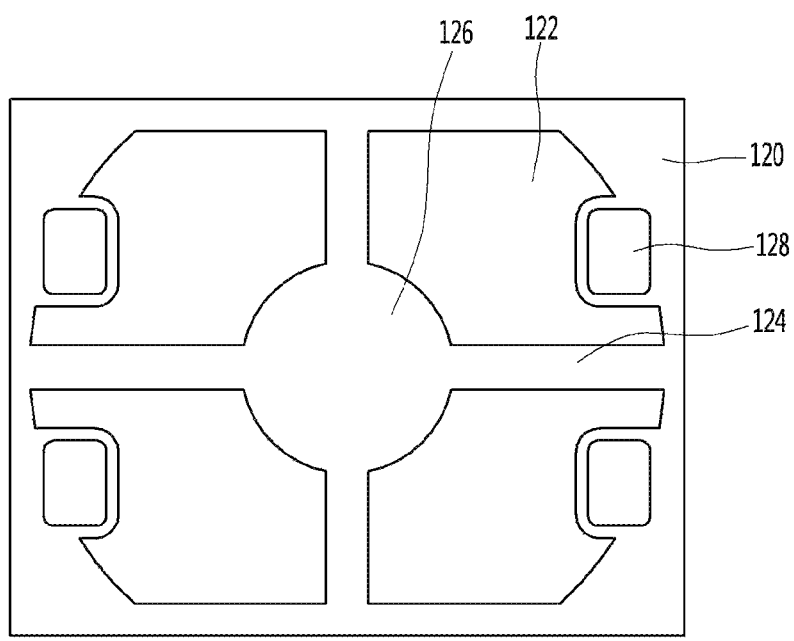
FIG. 5 is an enlarged view of a part A of a touch board illustrated in FIG. 4.
Figure 7A:
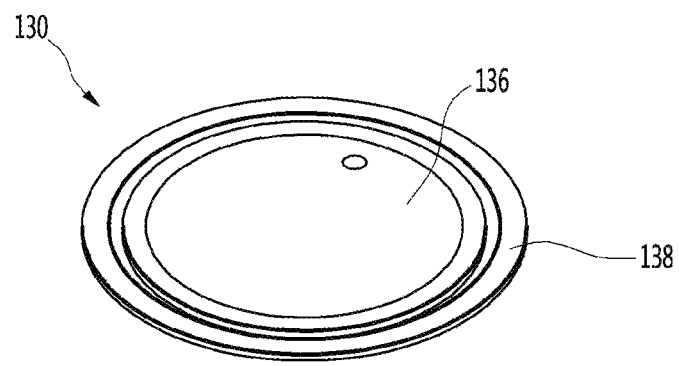
FIGS. 7A and 7B are an enlarged view and a side view, respectively, of a part B illustrated in FIG. 4.
Figure 7B:
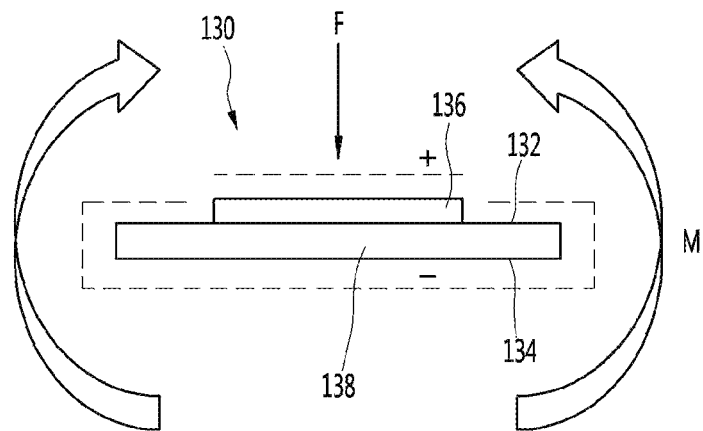
Figure 8:
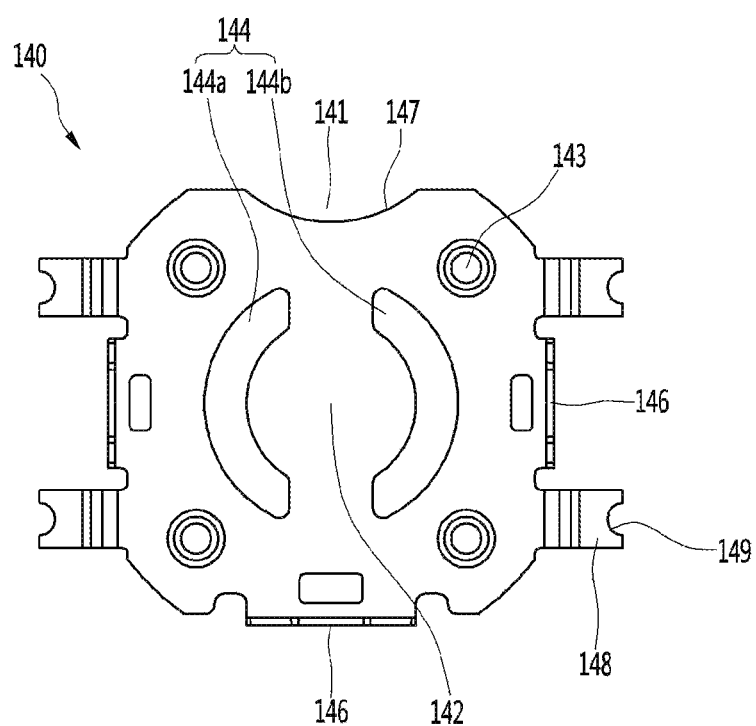
FIG. 8 is an enlarged view of a part C illustrated in FIG. 4.
Figure 9:
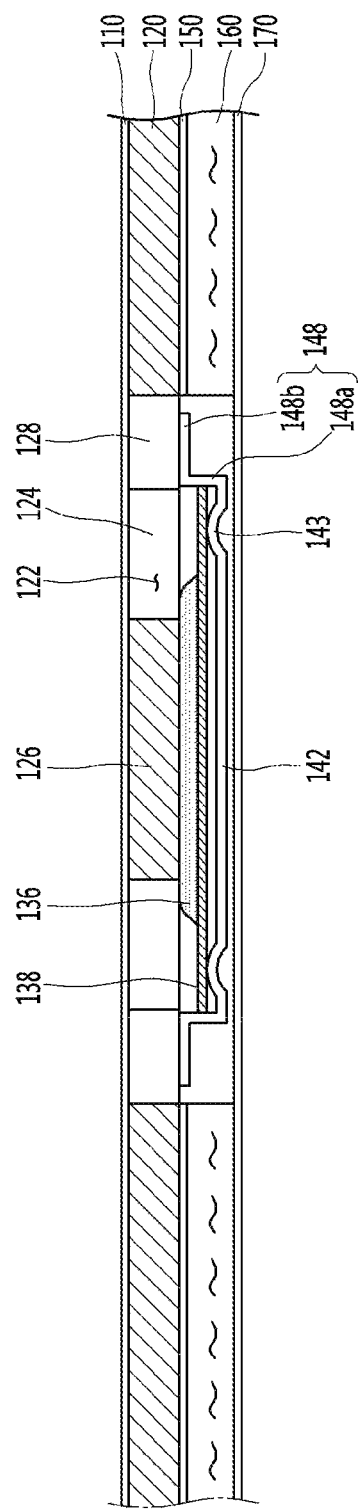
FIG. 9 is a cross-sectional view of the touch sensor assembly taken alone a line IX-IX of FIG. 2 when the touch sensor assembly illustrated in FIG. 4 has been assembled.
Figure 10:
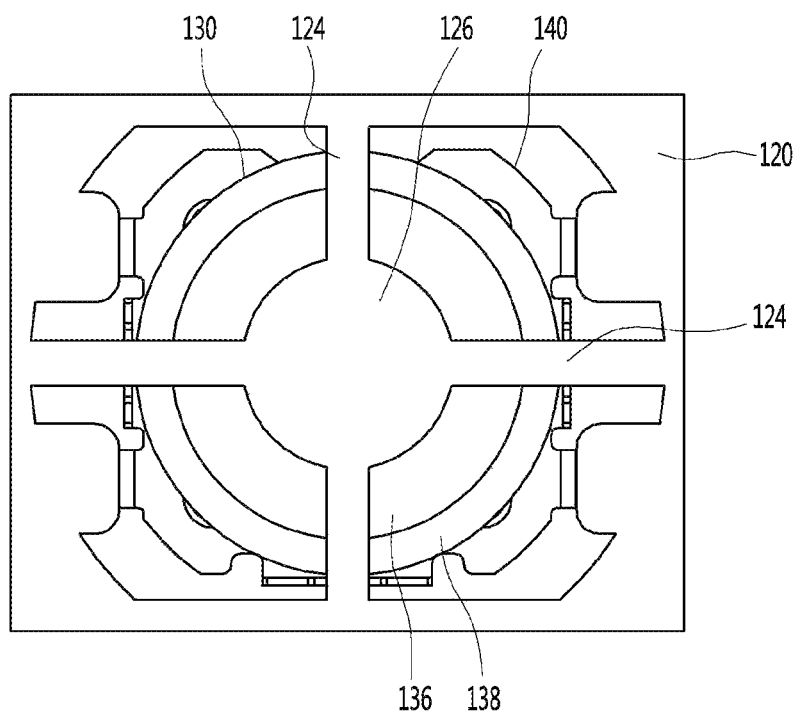
FIG. 10 is a front view illustrating an assembled state of a portion of a touch board, a holder, and a piezo disc of the touch sensor assembly of FIG. 4.

FIG. 4 illustrates an exploded perspective view of the touch sensor assembly illustrated in FIG. 3; FIG. 5 illustrates an enlarged view of a part A of a touch board illustrated in FIG. 4; FIGS. 6A to 6D are front and rear views illustrating various implementations of the touch board part A illustrated in FIG. 5; FIGS. 7A and 7B illustrate an enlarged view and a side view, respectively, of a part B illustrated in FIG. 4; FIG. 8 illustrates an enlarged view of a part C illustrated in FIG. 4; FIG. 9 illustrates a cross-sectional view of the touch sensor assembly taken alone a line IX-IX of FIG. 2 when the touch sensor assembly illustrated in FIG. 4 has been assembled; FIG. 10 illustrates a front view illustrating an assembled state of a portion of a touch board, a holder, and a piezo disc of the touch sensor assembly of FIG. 4; and FIG. 11 illustrates a rear view of FIG. 10.

The entire structure of the touch sensor assembly and individual components of the touch sensor assembly are described hereafter in detail with reference to FIGS. 4 to 11.

Referring to FIGS. 4 to 9, an external shape of the touch sensor assembly 100 is formed by attaching a touch board 120 and the guide board 160 by applying a second adhesive member 150 between the touch board 120 and the guide board 160. The touch board and the guide board may be PCBs (Printed Circuit Board) having a predetermined thickness. The guide board, however, is not necessarily a PCB and may be made from, for example, synthetic resins and plastic using injection molding.

Holders 140 fixed to the touch board 120 and piezo discs 130 fitted in the holders 140 are inserted in seating holes 162 formed in the guide board 160. The guide board 160 can function as a portion of the body of the touch sensor assembly 100 while forming the entire external shape, and can function as a portion of a housing that receives various components of the touch sensor assembly 100. Accordingly, the material and the manufacturing of the guide board 160 can be changed in various ways as long as they satisfy the functions of the guide board 160.

A first adhesive member 110, e.g., a double-sided tape, is attached to the outer side of the touch board 120. The outer side of the touch board 120 is opposite to the side on which the guide board is positioned. The first adhesive member 110 attaches the outer side of the touch board 120 to the rear side of the front panel 20 of the refrigerator door. The first adhesive member 110 may provide a watertight seal between the touch board 120 and the structure positioned on the touch board 120, e.g., front panel 20.

A third adhesive member 170 is attached to the outer side (or the rear side) of the guide board 160, that is, the side opposite to the inner side (or the front side) on which the touch board is disposed, thereby making the guide board 160 and the structure mounted on the guide board 160 watertight. In some implementations, the third adhesive member 170 is formed from PET.

The touch board 120 may be positioned on the rear side of the touch area 22 on the front panel 20. In an implementation of the present disclosure, the touch points 21 are spaced from each other and arranged in a line on the front panel 20, resulting in an elongated rectangular shape of the touch area 22. Accordingly, the touch board 120 may also be formed in a long rectangular shape.

Referring to FIG. 5, holes 122 may be formed in the touch board 120 at positions corresponding to the touch points 21 of the front panel 20 when the touch board 120 is attached to the rear side of the front panel 20. As shown in FIG. 5, each hole 122 may be formed by more than one cutouts in the touch board 120. Although the outlines of the holes 122 are formed in a substantially rectangular shape in an implementation of the present disclosure, other shapes are possible as well. The centers of the holes 122 are aligned with the centers of the touch points 21 of the front panel 20.

A pressing portion 126 is formed at the center of the hole 122 and one or a plurality of bridges 124 connecting the inner edge of the hole 122 and the edge of the pressing portion 126 is formed by the hole 122.

In other words, the bridges 124 may be formed by punching the touch board 120 to create the holes 122, leaving behind bridges 124.

The pressing portions 126 may be formed in a shape corresponding to the shape of piezo discs to be described below and smaller than the piezo discs. For example, piezo discs 130 and pressing portions 126 corresponding to the piezo discs can be circular as shown.

Since the holes 122 are formed at the touch board 120, and the bridges 124 are connected to the pressing portions 126 at the centers of the holes 122, the pressing portions 126 can be elastically moved when the user presses the touch points 21. That is, when a user presses a touch point 21 on the front panel and the force is transmitted to a pressing portion 126, the bridges 124 are elastically deformed and the pressing portion 126 is pushed back (i.e., towards the second side of the touch board 120) from the touch board 120.

Although a structure elastically supporting a pressing portion 126 with four bridges 124 is shown in FIG. 5, the present disclosure is not limited thereto. That is, the structure can be freely changed in any other ways as long as the pressing portion 126 can be easily moved in response to touch pressure from a user and has sufficient durability against repeated pressing.

Various modifications of the implementation having four bridges with regular intervals of 90 degrees (see FIG. 5 and FIG. 6A) are possible. For example, referring to FIG. 6B, a beam structure in which bridges are formed at 180 degrees from each other may be implemented. As another example, referring to FIG. 6C, a cantilever structure in which only two bridges are formed at 90 degrees from each other may be implemented. As yet another example, referring to FIG. 6D, a cantilever structure in which only one bridge is formed may be implemented. Such cantilever structures may be more easily deformed by touch pressure from a user, so touch sensitivity may be further increased.

On the other hand, as shown in FIG. 5, fixing faces 128 that fix fixing legs 148 of a holder 140 to be described below may be formed around the hole 122.

According to an implementation, the fixing faces 128 may protrude toward the pressing portion 126 from the edge of the hole 122, but the positions of the fixing faces 128 are not limited thereto.

The touch board 120 according to the first implementation is a long narrow rectangular plate and both sides (defined as long sides), which are adjacent to the long sides (the left and right edges) of the touch board 120, of the holes 122 are parallel with the long sides of the touch board 120, so the touch board 120 can be made slim.

Further, since the fixing faces 128 are formed along the short sides perpendicular to the long sides of the holes 122, inlets 141 of the holders 140 can be open towards a side of the touch board 120, aiding easy insertion of the piezo discs 130.

The holes 122, the bridges 124, and the pressing portions 126 can be formed at the same time on the touch board 120 by punching the other portion of the touch board 120 excluding the bridges 124, the pressing portions 126, and the fixing faces 128, as described above.

Electric wires are provided on the touch board 120. The electric wires may include first wires 1201 connected to the pressing portions 126 through the bridges 124 and second wires 1202 connecting the fixing faces 128 (see FIGS. 12A and 12B). This configuration is for determining whether the piezo discs to be described below have been pressed. That is, when a piezo disc is pressed and a potential difference is generated, electromotive force can be sensed through the wires.

Referring to FIGS. 4 to 9, the guide board 160 is a substrate-shaped injection molded part that is attached to the bottom (or the rear side) of the touch board 120 by the second adhesive member 150. In some implementations, the second adhesive member 150 may be a double-sided tape that is attached to both of the boards 120 and 160.

The guide board 160 is a flat rectangular plate with an outline corresponding to the touch board 120 and has the seating holes 162 at positions corresponding to the holes 122 of the touch board 120.

The seating holes 162 have an area that is sufficient for receiving the holders 140 and the piezo discs 130 fitted inside the holders 140. Further, the guide board 160 may have a thickness that is equal to or slightly larger than the height of the holders 140. Accordingly, the holders 140 seated in the seating holes 162 do not protrude from the surface of the guide board 160.

To accommodate the holders 140 positioned in the holes 122 of the touch board 120, the second adhesive member 150 also has holes 152 having the same size as the seating holes 162 at positions corresponding to the seating holes 162 of the guide board 160.

Referring to FIGS. 4, 8, and 9, the holders 140 are parts fixed inside the holes 122 of the touch board 120, and when the holders 140 are fixed to the touch board 120, the piezo discs 130 can be inserted in spaces formed by the assembly of the holders 140 and the touch board 120. As the piezo discs 130 are inserted in the spaces formed by the assembly of the holders 140 and the touch board 120, the piezo discs 130 can be stably fixed to the touch board 120.

The holders 140 have a rear side support portion 142 formed in a quadrangular shape, e.g., a rectangular or a square shape, to cover the holes 122 of the touch board.

When the holder 140 is fixed to the touch board 120, the rear side support portion 142 is spaced at a predetermined distance from the surface of the touch board 120. The gap between the rear side support portion 142 and the touch board 120 may depend on the height of fixing legs 148 formed with bends at the edges of the rear side support portion 142 (see FIG. 9).

In cases where the rear side support portion 142 of the holder 140 is a rectangle having a pair of long sides that is parallel with the long sides of the touch board 120 and a pair of short sides that is parallel with the short sides of the touch board 120, the fixing legs 148 are formed on the short sides of the rear side support portion 142. A pair of fixing legs 148 is formed and spaced from each other on each of the short sides of the rear side support portion 142.

The fixing legs 148 each have a first bending portion 148a bending at the edge, e.g., the short side of the rear side support portion 142, and a second bending portion 148b bending at the end of the first bending portion 148a in parallel with the rear side of the touch board 120. The gap between the rear side support portion 142 and the touch board 120 may be determined by the length of the first bending portion 148a. The second bending portion 148b may form an electrical contact with the fixing face 128 by soldering. That is, the holder 140 may be fixed to the touch board 120 by soldering the fixing legs 148 to the fixing faces 128.

In some implementations, the fixing faces 128 of the touch board 120 may be provided in pairs on each of the sides facing each other (e.g., short sides) of the hole 122, providing a total of four fixing faces. In some implementations, the fixing legs 148 may be provided at four positions corresponding to the fixing faces 128. Via-holes 149 (or cut grooves) may be formed at the ends of the second bending portions 148b to facilitate secure soldering of the second bending portions 148b to the fixing faces 128.

Further, a support wing 146 may be formed on sides, that is, the short sides of the rear side support portion 142 between adjacent fixing legs 148. The support wings 146 bend perpendicularly at the short sides of the rear side support portion 142, supporting the edge of the piezo disc 130 inserted from a side of the holder 140. Accordingly, the piezo disc 130 can be secured by the holder 140 when it is assembled. The length of the support wing 146 may be equal to or slightly smaller than the length of the first bending portion 148*a*.

Since the fixing legs 148 are disposed on the short sides of the rear side support portion 142, and the inlet 141 of the holder 140 is formed at a long side of the rear side support portion 142, a piezo disc can be inserted from a side (a long side) of the touch board 120, facilitating easy insertion of the piezo disc. In other words, the piezo disc 130 can be inserted inside the holder 140 from the long side of the touch board 120 perpendicularly to the long side of the touch board 120.

Further, an arc-shaped guide groove 147 may be formed at the long side having the inlet 141 of the rear side support portion 142 to facilitate handling of the piezo disc 130 when inserting the piezo disc 130.

Pressing projections 143 for pressing and supporting the edge of the rear side of the piezo disc 130 are formed adjacent to corners on a first side of the rear side support portion 142. The first side of the rear side support portion 142 may be the side that faces the rear side of the touch board 120 when the holder 140 is coupled to the rear side of the touch board 120 and the opposite side to the first side may be a second side. The pressing projections 143 may protrude on the first side from the second side of the rear side support portion 142 and press the edge of the rear side of the piezo disc 130.

The pressing projections 143 may be formed outside of a first electrode 136 (described below) formed on the front side of the piezo disc 130

As shown in FIGS. 7A and 7B, the first electrode 136 formed at the center of the front side 132 of the piezo disc 130 slightly protrudes from the front side of the piezo disc. The first electrode 136 may be pressed and supported by coming in contact with the pressing portion 126 of the touch board.

As described above, since the pressing projections 143 are positioned outside of the first electrode 136 of the piezo disc 130, when a user touches the pressing portion 126 and the pressing portion 126 presses the first electrode 136 of the piezo disc 130, the pressing projections 143 press the edge of the rear side 134 of the piezo disc 130 in the opposite direction to the force pressing the first electrode 136. Accordingly, it is possible to tightly support the piezo disc 130 with minimum load on the portion where a potential difference is generated of the piezo disc 130. Further, a second electrode 138 (described below) of the piezo disc 130 is easily flexed, as compared with when the pressing projections 143 are not formed, so a pressure difference can be more easily sensed.

Arc-shaped slits 144 may be formed inside the rear side support portion 142. The slits 144 may be formed inside a region defined by lines connecting the four pressing projections 143. The slits 144 may include a first slit 144*a* and a second slit 144*b* symmetrically facing each other.

As the slits 144 are formed at the rear side support portion 142, the rear side support portion can be easily deformed around the slits. Accordingly, the center of the rear side support portion can be deformed somewhat with deformation at the center of the rear side of the piezo disc 130 that is slightly bent by the pressing force applied to the pressing portion 126 and the pressing projections 143.

The holder 140 may be made of electrically conductive metal that is conducive to forming the pressing projections, the slits, and the support wings by pressing and piercing a flat metal plate. The holder 140 is electrically connected to the second wire 1202 through the fixing faces 128.

Referring to FIGS. 7A and 7B, the piezo disc 130 has the second electrode 138. The second electrode 138 is a metallic flat plate having the front side 132 and the rear side 134. The first electrode 136 is disposed on the center of the front side 132 of the second electrode 138.

In some implementations, the first electrode 136 may be made of ceramic and the second electrode 138 may be made of electrically conductive metal.

The piezo disc 130, which is a circular flat plate, may have a diameter that is the same as or slightly smaller than the gap between the support wings 146 on the edges of the rear side support portion 142 of the holder 140 described above.

The piezo disc 130 is inserted in the space between the touch board 120 and the holder 140 fixed to the touch board 120. The guide groove 147 can guide the piezo disc 130 that is inserted into the space. The piezo disc 130 is inserted into the space such that the front side 132 having the first electrode 136 faces the rear side of the touch board 120 and the rear side 134 faces the rear side support portion 142 of the holder 140.

When the first electrode of the piezo disc 130 is pressed, a potential difference is generated between the first electrode and the second electrode. In consideration of the principle of the piezo disc 130, the wired surface of the pressing portion 126 configured to come in contact with the first electrode 136 on the front side 132 is exposed to be electrically connected to the first electrode. The first wire 1202 extending through the bridges 124 is electrically isolated from the outside to prevent electrical connection even when the bridges 124 of the touch board 120 come in contact with the front side 132 of the second electrode 138.

The wired surface of the pressing portion 126 may have a connecting layer 1261 made of copper or gold. The holder 140 is made of electrically conductive metal and is electrically connected to the second electrode 138 at the rear side 134. The connecting layer 1261 exposed on the pressing portion 126 may corrode as time passes, so it is preferable to apply thin solder on the exposed wired surface. Such a connecting layer is similarly exposed on the fixing faces 128, but as the fixing faces 128 are soldered to the fixing legs 148 of the holder 140, application of solder to the fixing faces 128 is not necessary.

The first wires 1201 on the touch board 120 are electrically connected to the pressing portions 126 and a wafer 180 (see FIG. 4) through the bridges 124. Further, adjacent fixing faces 128 are electrically connected to the wafer through the second wires 1261 on the touch board 120.

Accordingly, when a user presses a touch point 21, the corresponding pressing portion 126 is pressed by a predetermined force F and presses the corresponding piezo disc 130. The pressing portion 126 presses the center of the front side 132 of the piezo disc and the pressing projections 143 of the holder 140 support the rear side 134 of the piezo disc. The piezo disc 130 is deformed by moment M, and as a result, a potential difference is generated between the first electrode 136 and the second electrode 138. Micro current induced by electromotive force generated in this process is transmitted to a sensor controller through the wires and the wafer 180 on the touch board, which is processed by the controller to recognize the touching of the touch point 21.

In some implementations, a plurality of piezo discs is installed on a touch board. In some implementations, the wafer 180 for providing electrical connection between the piezo discs in the touch sensor assembly and the outside of the touch sensor assembly is provided.

Referring to FIG. 4, the wafer 180 may be mounted on the touch board 120. In some implementations, the wafer 180 may be positioned between holes, where piezo discs 130 are disposed, on the rear side of the touch board 120 where the holders 140 are fixed.

An open hole 164 may be formed at the guide board 160 to receive the wafer 180. The open hole 164 is open at a side of the guide board 160 and another open hole 154 may be formed through the second adhesive member 150 at the position corresponding to the open hole 164. Another open hole 174 corresponding to the open hole 164 may also be formed at the third adhesive member 170. A connector to be fitted to the wafer 180 may be fastened to the wafer 180 through the open holes.

The assembly order of the touch sensor assembly is described hereafter with reference to FIGS. 4 to 9.

First, a holder 140 is soldered to the rear side (the opposite side to the side facing the front panel) of the touch board 120. Then, the wafer 180 is also mounted. This process can be automated.

Next, a piezo disc 130 is inserted between the holder 140 and the touch board 120. The piezo disc 130 is guided by the guide groove 147 when it is inserted, so the piezo disc can be easily inserted even when manually inserted.

The piezo disc 130 has a circular shape, whereas the support wings 146 of the holder 140 are formed in a pair of lines. Accordingly, the piezo disc 130 is inserted until the edge comes in contact with the support wings 146, and is then further pushed, whereby the piezo disc 130 is inserted with the circular edge in contact with the support wings 146.

In particular, according to an implementation, since the touch board 120 has a long narrow rectangular shape and the piezo disc 130 can be inserted inside the holder 140 from a side, that is, a long side of the touch board 120, the piezo disc 130 can be more easily inserted.

FIGS. 10 and 11 respectively illustrate the front side and the rear side of a touch point of the touch sensor assembly with a holder 140 fixed to the touch board 120 and a piezo disc 130 inserted therebetween.

Next, the second adhesive member 150 is inserted between the touch board 120 and the guide board 160, the first adhesive member 110 is placed on the front side (the side facing the front panel) of the touch board 120, and the third adhesive member 170 is placed on the rear side of the guide board 160. This process can also be automated.

A release paper, which is removed later when the touch sensor assembly 100 is attached to the front panel 20 of the refrigerator door 10, is attached to the first adhesive member 110, so it is possible to keep the adhesive force of the surface of the first adhesive member 110.

A second implementation of a touch sensor assembly having modifications of the parts of the touch sensor assembly of the first implementation described above is described hereafter. Further, repeated configurations of the first implementation are not described in the following description of the second implementation.

Figure 13A:
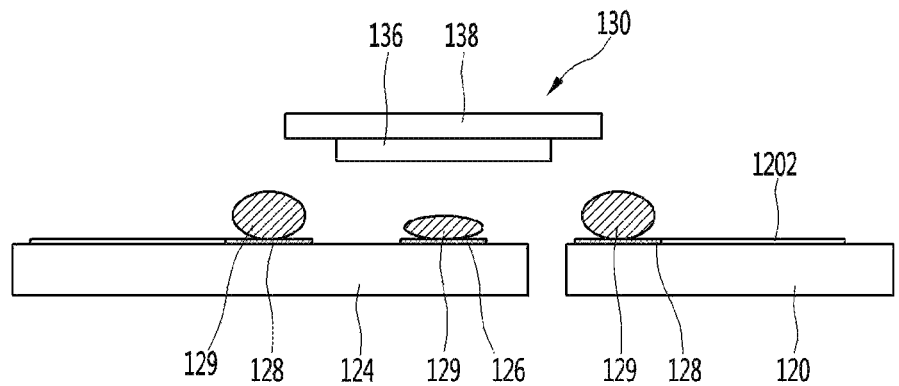
FIGS. 13A to 13C are side views illustrating a process of attaching a piezo disc to the touch board illustrated in FIGS. 12A and 12B.
Figure 13B:
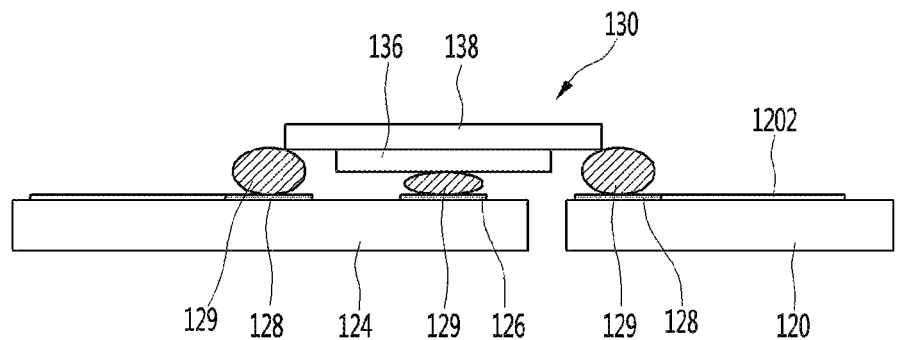
Figure 13C:
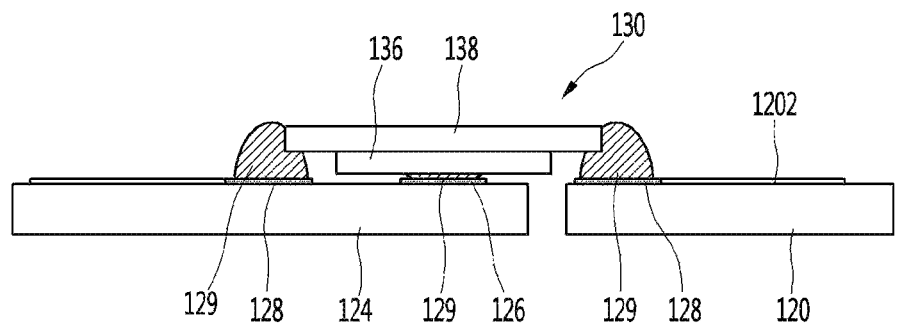
Figure 14:
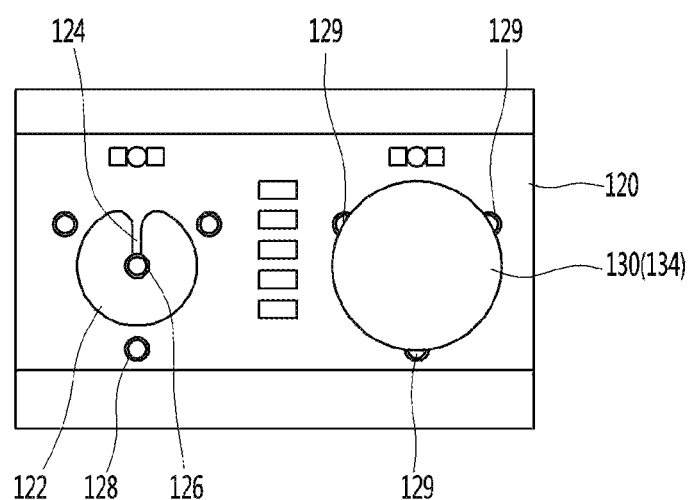
FIG. 14 is a rear view of the touch board illustrating the touch board before and after attaching of a piezo disc.
Figure 16A:
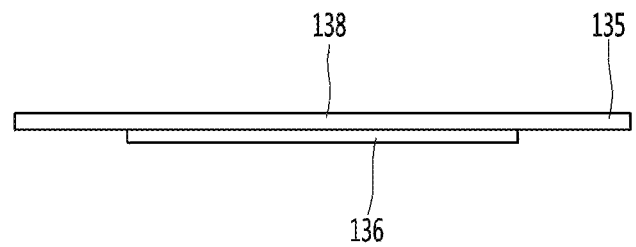
FIGS. 16A to 16C are side views illustrating various implementations of the piezo disc illustrated in FIGS. 15A to 15D.
Figure 16B:
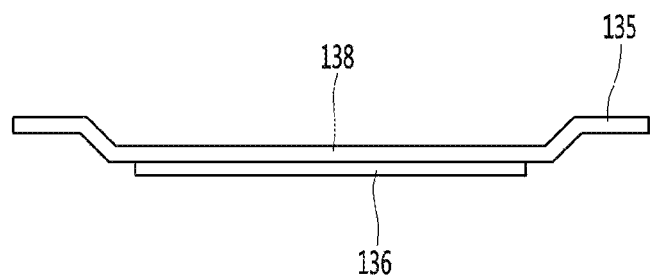
Figure 16C:
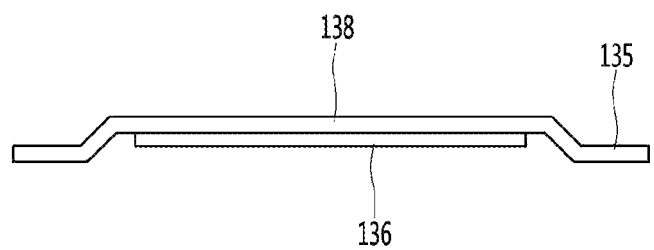
Figure 17:
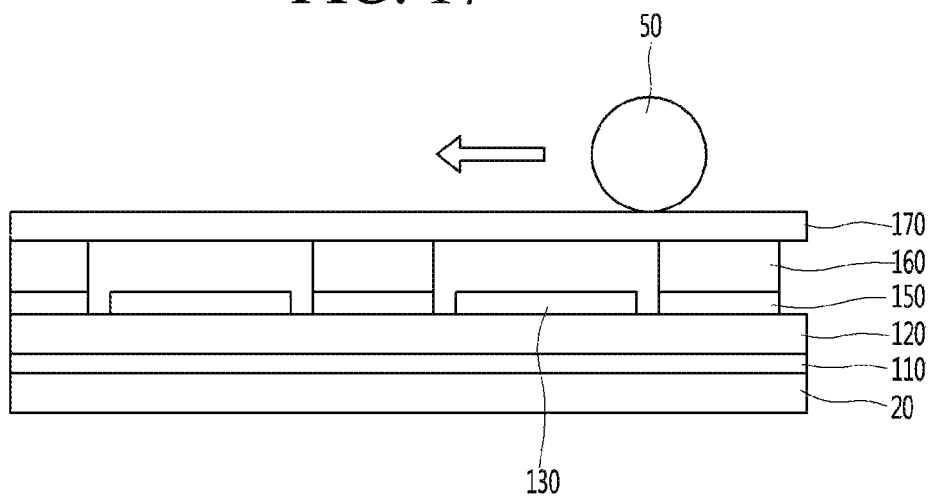
FIG. 17 is a cross-sectional view illustrating a process of attaching the touch sensor assembly having the touch board and the piezo disc illustrated in FIGS. 12A to 14 to the rear side of the front panel of a door.

FIGS. 12A and 12B illustrate various implementations of the touch board illustrated in FIG. 5; FIGS. 13A to 13C illustrate a process of attaching a piezo disc to the touch board illustrated in FIGS. 12A and 12B; FIG. 14 illustrates a rear view of the touch board before and after attaching of a piezo disc; FIGS. 15A to 15D illustrate front views of various implementations of the piezo disc that can be applied to the structure for attaching the piezo disc illustrated in FIGS. 12A to 14 to the touch board; FIGS. 16A to 16C illustrate side views of various implementations of the piezo disc illustrated in FIGS. 15A to 15D; and FIG. 17 illustrates a process of attaching the touch sensor assembly having the touch board and the piezo disc illustrated in FIGS. 12A to 14 to the rear side of the front panel of a door.

FIGS. 12A and 12B are enlarged views illustrating a hole 122 of a touch board 120 which is formed at the position corresponding to a touch point 21 of the front panel 20. The hole 122 shown in FIGS. 12A and 12B has a substantially circular shape, but it can be changed in various shapes, as described above.

However, piezo discs are directly fixed to a touch board 120 in the second implementation without holders. Accordingly, the hole 122 may be formed in the shape corresponding to a piezo disc 130.

The shape of the hole 122 provides flexibility to a pressing portion 126 and may be modified based on various factors. Examples of such various factors include the number or the positions of bridges 124 through which first wires 1201 extend from the pressing portion 126, the positions of fixing faces 128 to be described below, and the positions or directions of extensions 135 of the piezo disc 130.

A bridge 124 extends from the edge of the hole 122 to the pressing portion 126 at the center of the hole 122. The bridge 124 and the pressing portion 126 are both portions of the touch board 120. The pressing portion 126 is formed to be aligned with a touch point 21 of the front panel 20 when the touch sensor assembly 100 is attached to the rear side of the front panel 20.

A connecting layer 130 for electrical connection with a first electrode 136 of the piezo disc 130 is formed on the rear side (the opposite side to the side facing the front panel) of the pressing portion, as shown in the figures, and a first wire 1201 electrically connected to the connecting layer 1261 is embedded in the bridge 124 and thus not exposed to the outside. Since the first wire 1201 is embedded in the bridge, a short circuit due to contact between the first wire and a second electrode 138 of the piezo disc 130 is prevented.

Fixing faces 128 may be formed around the hole 122. Unlike the first implementation, the fixing faces 128 do not protrude inside the hole 122 in this implementation.

In some implementations, referring to FIG. 12A, three fixing faces 128 are formed with intervals of 120 degrees around the pressing portion 126. In some implementations, referring to FIG. 12B, two fixing faces 128 are formed with intervals of 180 degrees. In some implementations, the fixing faces 128 may be arranged such that about halves of the areas of the fixing faces 128 are covered by the outer portion of the piezo disc 130 when the center of the piezo disc 130 is aligned with the pressing portion 126. In some implementations, the fixing faces 128 may be designed to have a shape and an area that allow the outer portion of the piezo disc 140 to be securely fixed to the fixing faces 128 by cream solder 129.

A connecting layer that can come in electrical contact with the second electrode 138 of the piezo disc 130 may also be exposed on the fixing faces 128, similar to the pressing portion 126. The fixing faces 128 are connected with a second wire 1202.

Referring to FIGS. 13A to 14, first, cream solder 129 is applied to the pressing portion 126 and the fixing faces 128, as shown in FIG. 13A and at the left side in FIG. 14. Then, as shown in FIG. 13B, the first electrode 136 formed at the center portion of the front side 132 of the piezo disc 130 is aligned to the pressing portion 126. Next, the second electrode 138 formed around the edge of the front side 132 of the piezo disc 130 and the fixing faces 128 are aligned and the piezo disc 130 is put on the cream solder 129. Then, the cream solder is heated and melted. While the cream solder is molten, as shown in FIG. 13C, the first electrode 136 of the piezo disc 130 and the pressing portion 126, and the second electrode 138 and the fixing faces 128 are soldered to each other, fixing the piezo disc 130 to the touch board 120. That is, the piezo disc 130 and the touch board 120 are physically attached to each other and are in electrical contact with each other.

These processes illustrated in FIGS. 13A to 13C can all be automated. Therefore, according to the structure of the touch sensor assembly of the second implementation, it is possible to not only reduce the number of parts, but reduce the number of processes and automate all the processes.

Further, according to the structure of the second implementation, the connecting layers of the pressing portion 126 and the fixing faces 128 are all covered with the solder when the piezo disc is electrically connected and fixed. Accordingly, poor contact or corrosion of the connecting layers due to moisture is prevented. Further, a strongly watertight space for preventing corrosion may not be necessary.

FIGS. 15A to 16C illustrates various implementations of a piezo disc that can be applied to the touch sensor assemblies.

Figure 15A:
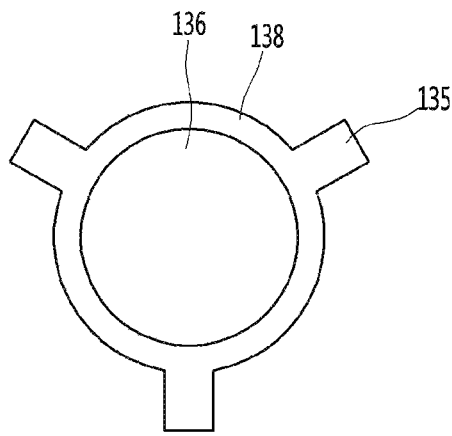
FIGS. 15A to 15D are front views illustrating various implementations of the piezo disc that can be applied to the structure for attaching the piezo disc illustrated in FIGS. 12A to 14 to the touch board.
Figure 15B:
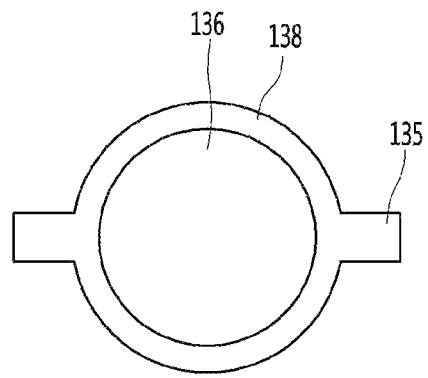

Referring to FIGS. 15A to 15B, extensions 135 extend outward from the edges of second electrodes 138. In some implementations, referring to FIG. 15A, three extensions 135 that radially extend are arranged with intervals of 120 degrees around a piezo disc 130. This configuration can be applied to the type of touch board shown in FIG. 12A. That is, the extensions 135 can be aligned with and soldered to the fixing faces 128 of the touch board 120.

In some implementations, referring to FIG. 15B, two extensions 135 that radially extend are arranged with intervals of 180 degrees around a piezo disc 130, which can be applied to the type of touch board shown in FIG. 12B.

Figure 15C:
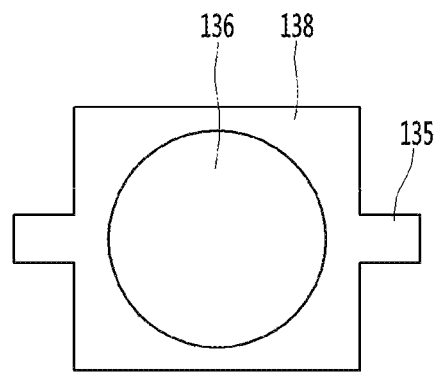

In some implementations, referring to FIG. 15C, the piezo disc 130 has a circular first electrode 136, a rectangular second electrode 138, and extensions 135 are formed at the centers of two facing sides of the second electrode 138. This configuration can also be applied to the type of touch board shown in FIG. 12B.

Figure 15D:
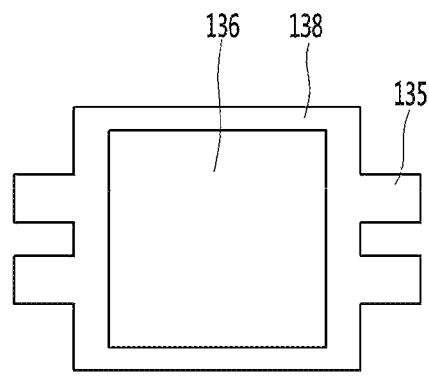

In some implementations, referring to FIG. 15D, the piezo disc 130 has a first electrode 136 and a second electrode 138 both having a rectangular shape, and a pair of extensions 135 is formed at the center of each of two facing sides of the second electrode 138. This configuration can be applied to the touch board of the first implementation shown in FIG. 5.

By forming extensions 135 at a second electrode 138 and using the extensions 135 as soldering areas, as described above, it is possible to expand a first electrode 136 into a size similar to the second electrode 138. When the first electrode 136 is expanded, the piezoelectric effect may be correspondingly increased, potentially increasing the sensitivity of a sensor to touch pressure.

In some implementations, referring to FIG. 16A, the extensions 135 extend in the same plane as the second electrode 138. In some implementations, referring to FIGS. 16B and 16C, the extensions 135 may extend in a different plane from the second electrode 138. For example, the extensions 135 may bend away from the first electrode 136 and then extend in parallel with the second electrode 138 as shown in FIG. 16B. As another example, they may bend toward the first electrode and then extend in parallel with the second electrode 138 as shown in FIG. 16C.

When the extensions 135 are bent, as described above, even if the heights of the pressing portion 126 and the fixing faces 128 that come in contact with the piezo disc are varied, it is possible to flexibly adapt to the variations. Further, it is also possible to adapt to a 3D structure of a touch board or a supporting electric connection structure.

As compared with second electrodes of the related art, it is possible to adjust the height of a second electrode formed from a metal plate by forming extensions at the second electrode, as described above. Accordingly, it is possible to more freely design a touch sensor assembly to which piezo discs are applied.

Next, after the piezo disc 130 is soldered to the touch board 120, as shown in FIG. 17, the first adhesive member 110 is attached to the front side, that is, the side facing the rear side of the front panel 20 of the touch board 120. In addition, the second adhesive member 150 is attached to the other portions except for the areas where the piezo discs are disposed on the rear side of the touch board 120. Furthermore, the guide board or the injection molding 160 may be positioned. The injection molding has a shape similar to the guide board described above in the first implementation and the injection molding 160 is configured to receive and protect the piezo discs 130. Further, the third adhesive member 170 may be provided on the guide board or the injection molding 160. Similar to the first implementation described above, the first adhesive member and the second adhesive member may be double-sided tapes, while the third adhesive member may be a one-sided tape. The third adhesive member functions as a cover layer that prevents penetration of moisture and protects the piezo discs from the outside by covering the spaces in which the piezo discs are received by the injection molding 160. Further, similar to the first implementation, a wafer 180 may be mounted at a side on the touch board 120.

According to the second implementation, the connecting layers of the pressing portion 126 and the fixing faces 128 of the touch board are all soldered and surely electrically connected to the piezo discs. Accordingly, the second implementation may be more robust against penetration of moistures and thus more reliable than the first implementation. However, even in this configuration, the third adhesive member 170 may be additionally provided to increase reliability of the product.

In some implementations, the contact force between the first to third adhesive members 110, 150, and 170 may be increased during the process of closely attaching the touch sensor assembly 100 of the second implementation to the rear side of the front panel 20.

That is, the touch sensor assembly 100 achieved by sequentially arranging the first adhesive member 110, the touch board 120, the piezo discs 130, the wafer 180, the second adhesive member 150, the injection molding 160, and the third adhesive member 170 is temporarily bonded to the rear side of the front panel 20 of the door 10 through the first adhesive member 110 and then the third adhesive member 170 is pressed with a roller 50 on the rear side, in which the force from the roller is uniformly applied to the touch sensor assembly 100 in the movement direction of the roller. Accordingly, all the adhesive members are brought strongly in contact with their corresponding parts and bonding is finished.

Further, when the third adhesive member 170 is pressed by a roller that is the same or larger than the width of the rear side of the injection molding 160, the pressing force of the roller is not transmitted to the piezo discs 130, projecting the piezo discs 130.

In the previous implementations, the touch board 120 and the guide board or the injection molding 160 are fixed by the second adhesive member 150. However, in some implementations, they may be fixed by fitting or using specific fasteners.

Figure 18A:
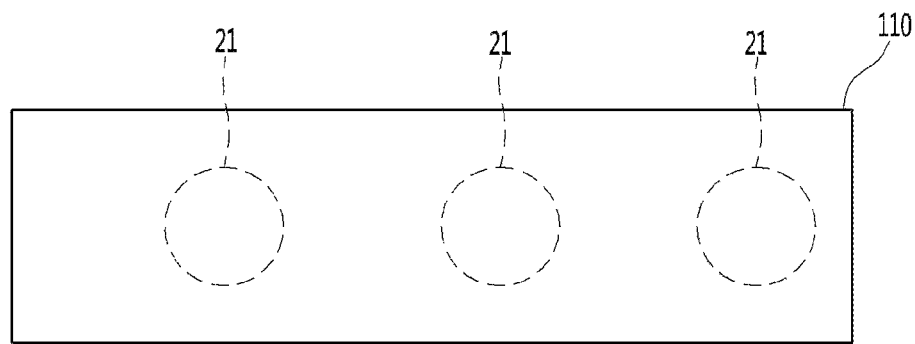
FIGS. 18A and 18B are a front view of a first adhesive member that is attached to the front side of the touch board of a touch sensor assembly and a cross-sectional view of a touch board and a piezo disc attached to the front panel of a refrigerator door using the first adhesive member.
Figure 18B:
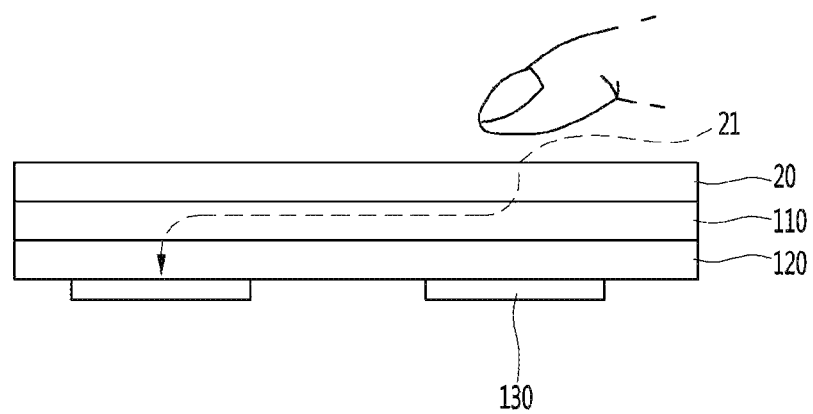
Figure 19A:
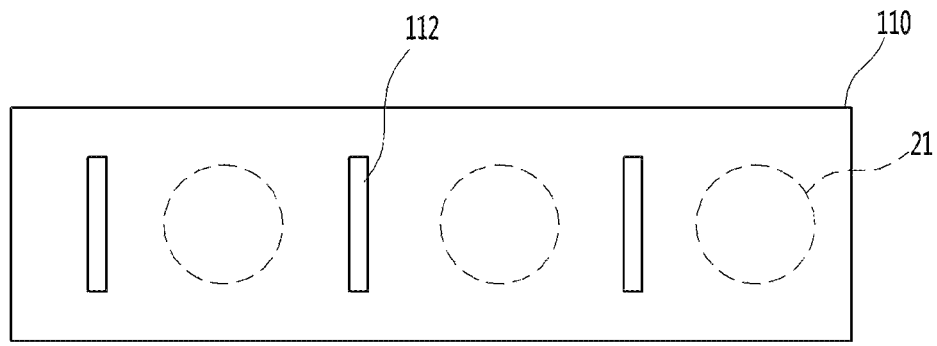
FIGS. 19A to 19C are views illustrating various implementations of FIGS. 18A and 18B.
Figure 19B:
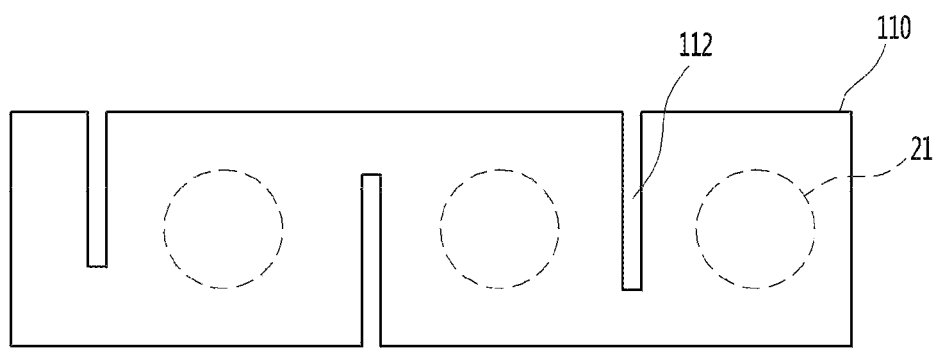
Figure 19C:
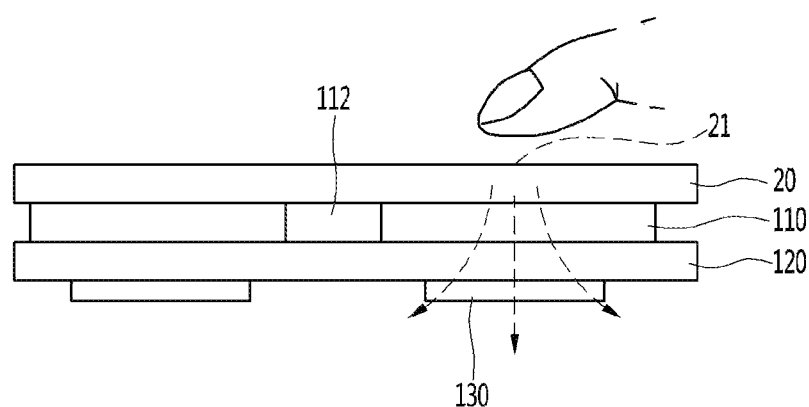

FIGS. 18A and 18B illustrate a front view of a first adhesive member that is attached to the front side of the touch board of a touch sensor assembly and a cross-sectional view of a touch board and a piezo disc attached to the front panel of a refrigerator door using the first adhesive member; and FIGS. 19A to 19C illustrates various implementations of FIGS. 18A and 18B.

Referring to FIG. 18A, the first adhesive member 110 of the touch sensor assembly described above may be a flat rectangular plate without a specific hole or slit.

When the entire area of the touch board 120 having a rectangular shape is covered with a double-sided tape, bubbles may form between the first adhesive member 110 and the touch board 120 in the process of attaching the double-sided tape.

Further, when the first adhesive member 110 has a continuous surface, that is, a surface without a cut portion or a slit, the pressing force applied to a touch point 21 may be likely to be transmitted to an adjacent piezo disc 130 through the first adhesive member 110, as indicated by an arrow in FIG. 18B.

However, referring to FIGS. 19A to 19C, when slits 112 are formed through the first adhesive member 110 between adjacent touch points 21, pressing force that is transmitted from a touch point 21 is isolated by the slits 112, as shown in FIG. 19C. Accordingly, the pressing force can be concentrated on the piezo disc 130 right under the touch point 21, and the potential for the pressing force being transmitted to an adjacent piezo disc 130 through the first adhesive member 110 is reduced.

Further, when the first adhesive member 110 is attached to the front side of the touch board 120 or the rear side of the front panel 20 of the door 10 by the roller 50 described above, bubbles can be easily pushed and removed through the slits 112 by the roller.

In some implementations, the slits 112 may be formed in a closed type between adjacent touch points 21, as shown in FIG. 19A. In some implementations, the slits 112 may be formed in an open type extending from a side of the first adhesive member 110 with an end open between adjacent touch points 21, as shown in FIG. 19B.

Further, adjacent slits 112 in the longitudinal direction of the first adhesive member 110 may extend alternatively from a side and the other side of the first adhesive member 110. That is, adjacent two slits 112 may extend in parallel toward each other from a side and the other side of the first adhesive member 110.

Figure 20:
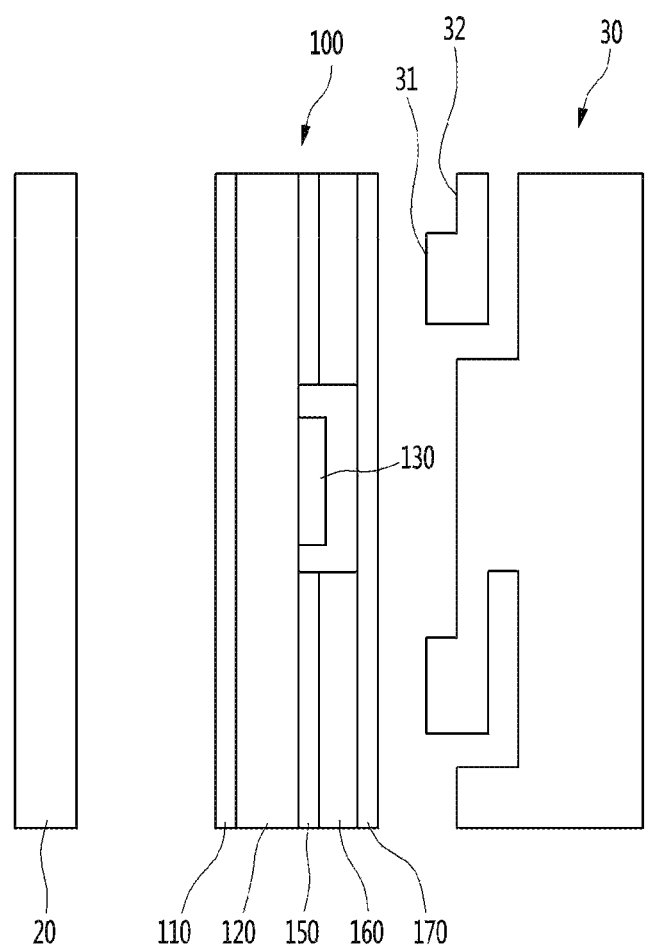
FIG. 20 is a view illustrating a process of attaching a touch sensor assembly to the rear side of a front panel and supporting the rear side of the touch sensor assembly with a support member.
Figure 21:
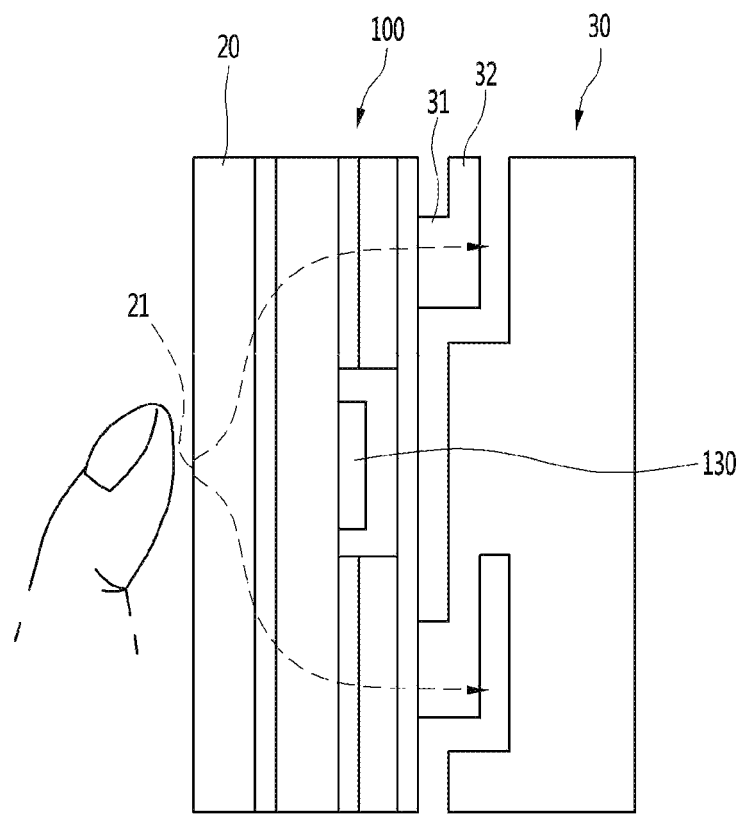
FIG. 21 is a view illustrating an assembly of the components illustrated in FIG. 20.
Figure 22:
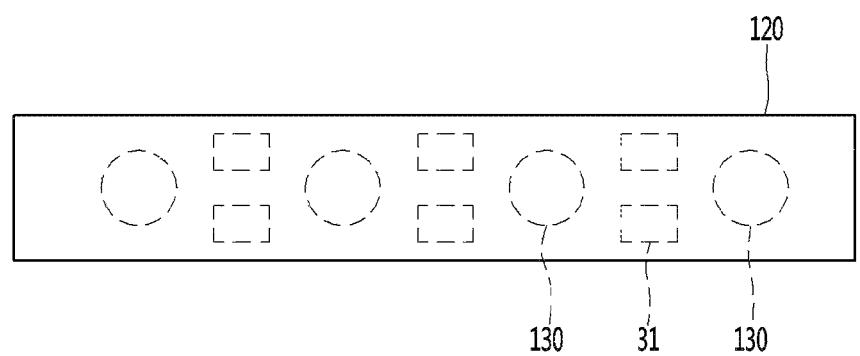
FIG. 22 is a plan view illustrating piezo disc placements and support member placements on the touch board of the touch sensor assembly illustrated in FIGS. 20 and 21.
Figure 23:
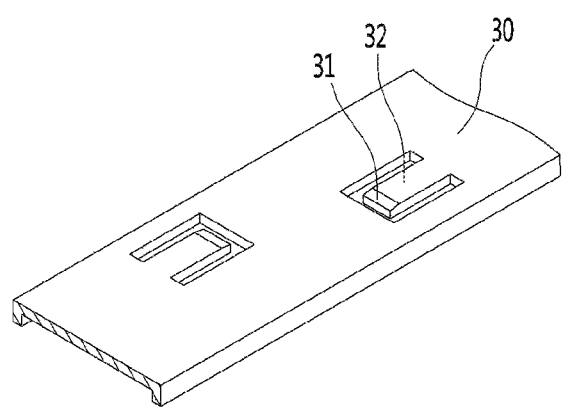
FIG. 23 is an enlarged perspective view of the support member having projections.

FIG. 20 illustrates a process of attaching a touch sensor assembly to the rear side of a front panel and supporting the rear side of the touch sensor assembly with a support member; FIG. 21 illustrates an assembly of the components illustrated in FIG. 20; FIG. 22 illustrates a plan view of the piezo disc placements and support member placements on the touch board of the touch sensor assembly illustrated in FIGS. 20 and 21; and FIG. 23 illustrates an enlarged perspective view of the support member having projections.

According to an implementation of the present disclosure, the front side of the touch sensor assembly is attached and fixed to the rear side of the front panel 20 of the door through the first adhesive member 110. However, it is possible that the adhesive force of the first adhesive member 110 may not be maintained throughout the lifespan of appliances, which can last over ten years. Accordingly, the touch sensor assembly 100 may partially or entirely detach from the front panel 20 of the door 10 in some cases. In particular, adhesive force may decline more if the user frequently presses the front panel 20.

In consideration of this problem, according to the present disclosure, a post-assembly process that presses forward the rear side of the touch sensor assembly 100 is provided to maintain the close contact by directly bonding and fixing the touch sensor assembly 100 to the rear side of the front panel 20.

Referring to FIGS. 20 and 21, the first adhesive member 110 of the touch sensor assembly 100 is attached to the rear side of the front panel 20, and as shown in FIG. 3, the front panel 20 and the door liner 40 are fastened such that projections 31 of a support member 30 fixed to the front of the door liner 40 supports by pressing forward the rear side of the touch sensor assembly 100.

The other side except for the projection 31 of the support member 30 looks spaced from the touch sensor assembly 100 due to exaggeration in FIG. 21, but the other side of the support member 30 supports the touch sensor assembly 100 in contact with it. However, it may be understood that the portion where the projection 31 is formed more strongly supports the touch sensor assembly 100.

Referring to FIG. 22, the projections 31 are spaced vertically from the portion where the piezo disc 130 is positioned on the touch sensor assembly 100, that is, from the touch point 21. Accordingly, as shown in FIG. 21, when a user presses the touch point 21, the pressure is directly transmitted to the piezo disc 130 and the projections 31 can support the touch point 21 while absorbing a portion of the pressure that is dispersed around. Therefore, it is possible to prevent a large portion of touch pressure applied to the touch point 21 by a user from being transmitted to another adjacent piezo disc from the piezo disc 130 pressed right behind the touch point 21.

When a user presses the portion between adjacent two touch points 21, the pressing force that is applied to the two touch points 21 around the portion pressed by the user is minimized because the projection 31 disposed right behind the pressed portion absorbs the pressing force, minimizing mis-sensing. That is, the effect of preventing mis-sensing a touch from a user is further increased by the projection 31 and the position supported by the projection 31.

When the projection 31 simply protrudes from the support member 30 and has excessive strength, the supporting pressure may cause an error of the sensor.

In consideration of this problem, as shown in FIGS. 20, 21, and 23, it may be possible to form an elastic portion 32 by providing a U-shape cutout in the support member 30 and form the projection 31 at the end of the elastic portion 32 such that the projection 31 can support the touch sensor assembly 100 with predetermined elasticity.

The structure of a touch sensor assembly and a method of manufacturing the touch sensor assembly were described for a refrigerator in the previous implementations. In general, however, the touch sensor assembly can be used in various fields such as an automotive door panel and other appliances in addition to a refrigerator.

A touch sensor assembly according to an implementation of the present disclosure may include: a touch board attached to the rear side of a panel having touch points; piezo discs in which a first electrode and a second electrode are disposed on each other and the first electrode is disposed at the center of at least the front side and that is fixed to the rear side of the touch board with the first electrode facing the touch board; pressing portions that are fixed to the touch board to provide flexibility, electrically come in contact with the first electrode, and are electrically connected to first wires on the touch board; and fixing faces that function as bases for fixing the piezo discs to the rear side of the touch board by supporting the second electrodes, electrically come in contact with the second electrodes, and are electrically connected to second wires on the touch board.

Holes are formed through the touch board at positions corresponding to the touch points and the pressing portion is connected to ends of bridges extending from the inner edge of the hole toward the center of the hole.

The first wire is electrically connected to the pressing portion through the bridges.

The bridges are radially formed around the pressing portion.

The bridges are asymmetrically formed around the pressing portion.

Anti-corrosion is applied to the surface of the pressing portion that is electrically connected to the first electrode.

Holders for providing a fixing force that fixes the piezo discs to the rear side of the touch board by supporting the sides and rear sides of the piezo disc are disposed under the fixing faces.

The holder has a thermal conductive material, is electrically connected with the second electrode at the portion being in contact with the piezo disc, and is electrically connected with the fixing faces.

The holder may have: a rear side support portion that supports the rear side of the piezo disc; support wings that extend toward the touch board from sides of the rear side support portion to support sides of the piezo disc; and fixing legs that extend outward from the support wings in parallel with a plane including the touch board to be fixed to the fixing faces of the touch board.

An inlet is formed at a side of the rear side support portion where the support wings are not formed so that the piezo disc can be inserted.

A guide groove that guides the piezo disc to be inserted is formed at an edge of the rear side support portion that is adjacent to the inlet.

The inlet is formed toward an edge of the touch board.

Pressing projections that protrude forward to press forward the rear side of the piezo disc are formed at the rear side supporting portion and press the edge of the rear side of the piezo disc.

Slits are formed around the center of the rear side support portion.

The fixing faces are soldered to the second electrode around the edge of the piezo disc.

The surface of the pressing portion is electrically connected to the first electrode by soldering.

The piezo disc further has extensions that extend outward from the edge of the second electrode and the extensions of the second electrode are fixed to the fixing faces.

The extensions may be bent toward or away from the first electrode at the center portions.

A first adhesive member that provides an adhesive force for attaching the touch board to the rear side of the panel is disposed on the front side of the touch board.

Slits are formed through the first adhesive member between positions corresponding to the touch points of the panel by cutting portions of the first adhesive member.

The slits are formed to block adjacent two touch points.

The first adhesive member covers the portions, which correspond to the positions where the piezo discs are fixed, on the front side of the touch board.

A guide board or an injection molding that provides spaces for receiving the piezo discs are disposed on the rear side of the touch board.

The guide board or the injection molding and the rear side of the touch board are bonded and fixed to each other by a second adhesive member.

A cover layer that covers at least the spaces where the piezo discs are received is disposed on the rear side of the guide board or the injection molding.

An appliance having the touch sensor assembly according to an implementation of the present disclosure includes: a panel having a plurality of touch points; a touch sensor assembly that has piezo discs positioned to correspond to the touch points and includes a touch board fixed to the rear side of the panel; and a support member that is disposed on the rear side of the touch sensor assembly to support the rear side of the touch sensor assembly toward the panel when the panel is fixed to the appliance.

The support member has projections for supporting the rear side of the touch sensor assembly, between the piezo discs.

The projections are formed at elastic portions of the support member.

The touch board and the rear side of the panel are fixed through a first adhesive member.

The touch sensor assembly includes a guide board or an injection molding disposed on the rear side of the touch board to provide spaces for receiving the piezo discs and the support member supports the guide board or the injection molding.

A method of manufacturing a touch sensor assembly that is attached to the rear side of a panel having touch points to sense a touch on the touch points in accordance with an implementation of the present disclosure may include: preparing a touch board that has first and second wires, pressing portions elastically fixed to the touch board and electrically connected with the first wires, and fixing faces disposed around the pressing portions and connected with the second wires; and fixing piezo discs to the rear side of the touch board so that first electrodes and second electrodes are electrically connected to the pressing portions and the fixing faces of the touch board, respectively.

The preparing of a touch board may include: a process of patterning the first wires and the second wires on a PCB, exposing connecting layers on the pressing portions and the fixing faces, and forming holes around the pressing portions except for the first wires; and a process of forming bridges extending from the inner edges of the holes toward the pressing portions.

The fixing of piezo discs may include: a process of fixing holders having thermal conductivity to the fixing faces through soldering; and a process of inserting the piezo discs between the holders and the touch board such that first electrodes of the piezo discs are electrically connected with the pressing portions and second electrodes of the piezo discs are electrically connected with the holders.

The fixing of piezo discs may include: applying cream solder to the connecting layers exposed on the pressing portions and the fixing faces; placing the piezo discs on the rear side of the touch board such that the first electrodes of the piezo discs are positioned on the pressing portions and the second electrodes of the piezo discs are positioned on the connecting layers; fixing the first electrodes and the second electrodes of the piezo discs to the pressing portions and the fixing faces by heating the cream solder.

The method of manufacturing a touch sensor assembly according to an implementation of the present disclosure may further include disposing a guide board or an injection molding that has receiving portions for the piezo discs on the rear side of the touch board.

The method of manufacturing a touch sensor assembly according to an implementation of the present disclosure may further include disposing a cover layer on the rear side of the guide board or the injection molding and attaching the cover layer to the rear side of the guide board or the injection molding by pressing the cover layer with a roller having a width larger than the receiving portions.

It will be understood that various modifications may be made without departing from the spirit and scope of the claims. For example, advantageous results still could be achieved if steps of the disclosed techniques were performed in a different order and/or if components in the disclosed systems were combined in a different manner and/or replaced or supplemented by other components. Accordingly, other implementations are within the scope of the following claims.

What is claimed is:

1. A touch sensor assembly, comprising:
a touch board attached to a rear side of a panel, the panel having one or more touch points configured to receive touch input, the touch board having:
   a first side attached to a rear surface of the panel,
   a second side that is an opposite side of the first side,
   a hole defined at a position corresponding to a touch point among the one or more touch points,
   a pressing portion disposed in an inner side of the hole, the pressing portion disposed rearward of the touch point, and
   at least one bridge that connects an edge of the pressing portion to an edge of the hole and that allows the pressing portion to move based on pressing force being applied to the touch point;
a piezo disc comprising a first electrode and a second electrode, the first electrode contacting a rear side of the pressing portion and defining a front side of the piezo disc;
a first wire disposed on the touch board and electrically connected to the pressing portion;
a fixing base that fixes the piezo disc to the rear side of the touch board, that supports the second electrode, and that is configured to contact the second electrode; and
a second wire disposed on the touch board and electrically connected to the fixing base,
wherein the first wire is electrically connected to the pressing portion through the at least one bridge.

2. The touch sensor assembly according to claim 1, wherein the bridge radially extends from a circumference of the pressing portion.

3. The touch sensor assembly according to claim 1, wherein the bridge is asymmetrically arranged with respect to the pressing portion.

4. The touch sensor assembly according to claim 1, wherein the pressing portion comprises a surface that includes an anti-corrosion material and that is electrically connected to the first electrode.

5. A touch sensor assembly, comprising:
a touch board attached to a rear side of a panel, the panel having one or more touch points configured to receive touch input;
a piezo disc comprising a first electrode and a second electrode, the first electrode being fixed to a rear side of the touch board and disposed at a front side of the piezo disc that faces the touch board;
a pressing portion movably coupled to the touch board and configured to contact the first electrode, the pressing portion being electrically connected to a first wire disposed on the touch board;
a fixing base that fixes the piezo disc to the rear side of the touch board, that supports the second electrode, and that is configured to contact the second electrode, the fixing base being electrically connected to a second wire disposed on the touch board; and
a holder that is disposed rearward of the fixing base, that supports side portions of the piezo disc and a rear portion of the piezo disc, and that is configured to provide a fixing force that fixes the piezo disc to the rear side of the touch board,
wherein the holder includes a thermal conductive material, is electrically connected to the second electrode at a position in contact with the piezo disc, and is electrically connected to the fixing base.

6. A touch sensor assembly, comprising:
a touch board attached to a rear side of a panel, the panel having one or more touch points configured to receive touch input;
a piezo disc comprising a first electrode and a second electrode, the first electrode being fixed to a rear side of the touch board and disposed at a front side of the piezo disc that faces the touch board;
a pressing portion movably coupled to the touch board and configured to contact the first electrode, the pressing portion being electrically connected to a first wire disposed on the touch board;
a fixing base that fixes the piezo disc to the rear side of the touch board, that supports the second electrode, and that is configured to contact the second electrode, the fixing base being electrically connected to a second wire disposed on the touch board; and
a holder that is disposed rearward of the fixing base, that supports side portions of the piezo disc and a rear portion of the piezo disc, and that is configured to provide a fixing force that fixes the piezo disc to the rear side of the touch board,
wherein the holder comprises:
   a rear side support portion that supports the rear portion of the piezo disc;
   support wings that extend from edges of the rear side support portion toward the touch board and that support the side portions of the piezo disc, and
   fixing legs that extend outward of the support wings in a direction parallel to a plane including the touch board and that are fixed to the fixing base of the touch board.

7. The touch sensor assembly according to claim 6, wherein the rear side support portion defines an inlet that is disposed at a first side of the rear side support portion and that is configured to receive the piezo disc, and
wherein the support wings are not disposed at the first side of the rear side support portion.

8. The touch sensor assembly according to claim 7, wherein the rear side support portion defines a guide groove that is disposed at the first side of the rear side support portion and that is configured to guide insertion of the piezo disc to the holder.

9. The touch sensor assembly according to claim 7, wherein the inlet is open toward an edge of the touch board.

10. The touch sensor assembly according to claim 6, wherein the holder further comprises a pressing projection that protrudes forward from the rear side supporting portion toward the touch board and that provides pressure to the rear portion of the piezo disc toward the touch board.

11. The touch sensor assembly according to claim 6, wherein the rear side support portion defines at least one slit around a center of the rear side support portion.

12. The touch sensor assembly according to claim 1, wherein the fixing base is soldered to the second electrode around an edge of the piezo disc.

13. The touch sensor assembly according to claim 12, wherein a surface of the pressing portion is electrically connected to the first electrode by soldering.

14. The touch sensor assembly according to claim 12, wherein the piezo disc further comprises an extension that extends outward from the second electrode and that is fixed to the fixing base.

15. The touch sensor assembly according to claim 14, wherein the extension is bent from an end of the second electrode toward the first electrode, or bent from the end of the second electrode away from the first electrode.

16. The touch sensor assembly according to claim 1, further comprising a first adhesive member that is disposed at a front side of the touch board and that couples the touch board to the rear side of the panel.

17. The touch sensor assembly according to claim 16, wherein the first adhesive member defines a slit that passes through the first adhesive member and that is disposed between positions corresponding to the one or more touch points of the panel.

18. The touch sensor assembly according to claim 17, wherein the slit is configured to isolate one of the one or more touch points from another of the one or more touch points adjacent to the one of the one or more touch points.

19. The touch sensor assembly according to claim 16, wherein the first adhesive member covers a portion of the front side of the touch board corresponding to the piezo disc.

20. The touch sensor assembly according to claim 1, further comprising a guide board or an injection molding that is disposed on the rear side of the touch board and that defines a receiving space configured to receive the piezo disc.

21. The touch sensor assembly according to claim 20, wherein the guide board or the injection molding is bonded to the rear side of the touch board by a second adhesive member.

22. The touch sensor assembly according to claim 20, further comprising a cover layer that is disposed on a rear side of the guide board or the injection molding and that covers the receiving space.

23. A touch sensor assembly, comprising:
a touch board attached to a rear side of a panel, the panel having one or more touch points configured to receive touch input;
a piezo disc comprising a first electrode and a second electrode, the first electrode being fixed to a rear side of the touch board and disposed at a front side of the piezo disc that faces the touch board;
a pressing portion movably coupled to the touch board and configured to contact the first electrode, the pressing portion being electrically connected to a first wire disposed on the touch board; and
a fixing base that fixes the piezo disc to the rear side of the touch board, that supports the second electrode, and that is configured to contact the second electrode, the fixing base being electrically connected to a second wire disposed on the touch board,
wherein the pressing portion comprises a surface that includes an anti-corrosion material and that is electrically connected to the first electrode.

24. A touch sensor assembly, comprising:
a touch board attached to a rear side of a panel, the panel having one or more touch points configured to receive touch input;
a piezo disc comprising:
a first electrode and a second electrode, the first electrode being fixed to a rear side of the touch board and disposed at a front side of the piezo disc that faces the touch board, and
an extension that extends outward from the second electrode;
a pressing portion movably coupled to the touch board and configured to contact the first electrode, the pressing portion being electrically connected to a first wire disposed on the touch board; and
a fixing base that fixes the piezo disc to the rear side of the touch board, that supports the second electrode, and that is configured to contact the second electrode, the fixing base being electrically connected to a second wire disposed on the touch board,
wherein the extension is fixed to the fixing base, and
wherein the extension is bent from an end of the second electrode toward the first electrode, or bent from the end of the second electrode away from the first electrode.

* * * * *